United States Patent
Shin et al.

(10) Patent No.: US 12,242,729 B2
(45) Date of Patent: Mar. 4, 2025

(54) RECONFIGURABLE ON-CHIP MEMORY BANK, RECONFIGURABLE ON-CHIP MEMORY, SYSTEM-ON-CHIP HAVING SAME MOUNTED THEREON, AND METHOD FOR USING RECONFIGURABLE ON-CHIP MEMORY

(71) Applicant: Rebellions Inc., Seongnam-si (KR)

(72) Inventors: Wongyu Shin, Seongnam-si (KR); Jinwook Oh, Seongnam-si (KR)

(73) Assignee: Rebellions Inc., Seongnam-si (KR)

( * ) Notice: Subject to any disclaimer, the term of this patent is extended or adjusted under 35 U.S.C. 154(b) by 230 days.

(21) Appl. No.: 18/046,100

(22) Filed: Oct. 12, 2022

(65) Prior Publication Data
US 2023/0161480 A1 May 25, 2023

(30) Foreign Application Priority Data
Nov. 22, 2021 (KR) .................. 10-2021-0161074

(51) Int. Cl.
- G06F 3/06 (2006.01)
- G06N 3/063 (2023.01)
- G06N 3/08 (2023.01)

(52) U.S. Cl.
CPC .......... *G06F 3/0613* (2013.01); *G06F 3/0659* (2013.01); *G06F 3/0673* (2013.01); *G06N 3/063* (2013.01); *G06N 3/08* (2013.01)

(58) Field of Classification Search
CPC .... G06F 3/0613; G06F 3/0659; G06F 3/0673; G06N 3/063; G06N 3/08
See application file for complete search history.

(56) References Cited

U.S. PATENT DOCUMENTS

2008/0320277 A1* 12/2008 Fish, III ............... G06F 9/38
    712/E9.071
2010/0325368 A1* 12/2010 O'Brien .............. G06F 13/1652
    711/170

(Continued)

FOREIGN PATENT DOCUMENTS

KR    10-2258566 B1    6/2021

OTHER PUBLICATIONS

Lecture slides "18-447 Computer Architecture Lecture 21: Main Memory by Prof. Onur Mutlu, Carnegie Mellon University", published Mar. 23, 2015 (Year: 2015).*

(Continued)

*Primary Examiner* — Michael Krofcheck
*Assistant Examiner* — Janice M. Girouard
(74) *Attorney, Agent, or Firm* — BROADVIEW IP LAW, PC

(57) ABSTRACT

A reconfigurable on-chip memory bank, reconfigurable on-chip memory, system-on-chip having same mounted thereon, and method for using reconfigurable on-chip memory is provided. The reconfigurable on-chip memory bank comprises a cell array in which a plurality of cells are arranged and data are stored, a first path unit configured to move data in the cell array, a second path unit configured to move data in the cell array and a bank controller operably coupled with the first and second path units, and configured to determine, according to a path control signal during runtime, data path which data are to be transmitted to or received from, to use a first address system when the first path unit is determined to be the data path, and to use a second address system different from the first address system when the second path unit is determined to be the data path.

31 Claims, 18 Drawing Sheets

(56) References Cited

U.S. PATENT DOCUMENTS

2018/0188769 A1* 7/2018 Chen ..................... G06F 11/24
2020/0051309 A1* 2/2020 Labbe .................... G06T 15/40
2021/0263739 A1   8/2021 Norrie et al.

OTHER PUBLICATIONS

An article titled "Tiered-Latency DRAM: A Low Latency and Low Cost DRAM Architecture" HPCA 2013, attached to this office action and available online at http://users.ece.cmu.edu/~omutlu/pub/tldram_hpca13.pdf. (Year: 2013).*

A screen shot of the Cambridge Dictionaries Online take Mar. 5, 2015 of the terms "If or when?" that discloses we use If to introduce a possible or unreal situation or condition. We use when to refer to the time of a future situation or condition that we are certain of. (Year: 2015).*

A screen shot of "Deep Learning 101: Beginners Guide to Neural Network" published by Analytics Vidhya and captured on archive.org on Mar. 1, 2021 that shows inputs to neural networks may simply be values. (Year: 2021).*

Office Action for KR 10-2021-0161074 by Korean Intellectual Property Office dated Aug. 8, 2023.

* cited by examiner

RECONFIGURABLE ON-CHIP MEMORY BANK, RECONFIGURABLE ON-CHIP MEMORY, SYSTEM-ON-CHIP HAVING SAME MOUNTED THEREON, AND METHOD FOR USING RECONFIGURABLE ON-CHIP MEMORY

CROSS-REFERENCE TO RELATED APPLICATION

This application claims priority under 35 U.S.C § 119 to Korean Patent Application No. 10-2021-0161074 filed in the Korean Intellectual Property Office on Nov. 22, 2021, the entire contents of which are hereby incorporated by reference.

TECHNICAL FIELD

The disclosure relates to a reconfigurable on-chip memory bank, a reconfigurable on-chip memory, a system-on-chip having the same mounted thereon, and a method of using the reconfigurable on-chip memory. More particularly, the disclosure relates to, for example, but not limited to, a reconfigurable on-chip memory bank capable of reconfiguring memory according to the characteristics of calculation tasks, a reconfigurable on-chip memory, a system-on-chip having the same mounted thereon, and a method of using the reconfigurable on-chip memory.

BACKGROUND

For the last few years, artificial intelligence technology has been the core technology of the Fourth Industrial Revolution and the subject of discussion as the most promising technology worldwide. The biggest problem with such artificial intelligence technology is computing performance. For artificial intelligence technology which realizes human learning ability, reasoning ability, perceptual ability, natural language implementation ability, etc., it is of utmost important to process a large amount of data quickly.

The central processing unit (CPU) or graphics processing unit (GPU) of off-the-shelf computers was used for deep-learning training and inference in early artificial intelligence, but had limitations on the tasks of deep-learning training and inference with high workloads, and thus, artificial intelligence processing cores that are structurally specialized for deep learning tasks have received a lot of attention.

In the case of a system-on-chip having a plurality of such artificial intelligence processing cores mounted thereon, an on-chip memory located within the chip is included together, and such an on-chip memory can be broadly divided into two types of memories: a scratch pad and a shared memory. The scratch pad is a private memory for each artificial intelligence processing core, while the shared memory can be used as a common memory for multiple artificial intelligence processing cores.

Although the optimal composition ratio of these two types of memories of the on-chip memory may vary depending on the characteristics of the calculation tasks of the artificial intelligence processing cores, the current on-chip memory is made with a fixed memory composition ratio, and thus, an inefficiency may occur in each calculation task.

The description set forth in the background section should not be assumed to be prior art merely because it is set forth in the background section. The background section may describe aspects or embodiments of the present disclosure.

SUMMARY

Aspects of the disclosure provide a reconfigurable on-chip memory bank capable of maximizing memory utilization.

Aspects of the disclosure provide a reconfigurable on-chip memory capable of maximizing memory utilization.

Aspects of the disclosure provide a system-on-chip having a reconfigurable on-chip memory capable of maximizing memory utilization mounted thereon.

Aspects of the disclosure provide a method of using a reconfigurable on-chip memory capable of maximizing memory utilization.

According to some aspects of the disclosure, a reconfigurable on-chip memory bank includes a cell array in which a plurality of cells are arranged and data are stored, a first path unit configured to move data in the cell array, a second path unit configured to move data in the cell array, and a bank controller operably coupled with the first and second path units, and configured to determine, according to a path control signal during runtime, a data path which data are to be transmitted to or received from, use a first address system when the first path unit is determined to be the data path, and use a second address system different from the first address system when the second path unit is determined to be the data path.

According to some aspects, the first path unit and the second path unit have different interfaces.

According to some aspects, a clock frequency of the first path unit is a multiple of a clock frequency of the bank controller.

According to some aspects, a clock frequency of the second path unit is not a multiple of the clock frequency of the bank controller.

According to some aspects, a first clock frequency of the first path unit is different from a first clock frequency of the second path unit.

According to some aspects, an interface of the first path unit is the same as an interface of the second path unit.

According to some aspects, a clock frequency of the first path unit is a multiple of a clock frequency of the bank controller and a clock frequency of the second path unit is a multiple of the clock frequency of the bank controller.

According to some aspects, a clock frequency of the first path unit is not a multiple of a clock frequency of the bank controller and a clock frequency of the second path unit is not a multiple of the clock frequency of the bank controller.

According to some aspects, the cell array includes static random-access memory (SRAM) cells.

According to some aspects, the first path unit directly transmits or receives the data to or from a first scratch pad used exclusively for a first processing unit.

According to some aspects, clock frequencies of the first path unit, the first processing unit, and the first scratch pad are all the same.

According to some aspects, the second path unit transmits or receives the data to or from an off-chip memory via a data bus.

According to some aspects, the data bus is operably coupled with the first scratch pad and a second scratch pad, and the second scratch pad is used exclusively for a second processing unit different from the first processing unit.

According to some aspects, clock frequencies of the second path unit and the data bus are the same.

According to some aspects, the path control signal is generated by a pre-designed device driver or compiler.

According to some aspects, the path control signal is generated based on an input received from a user.

According to some aspects of the disclosure, a reconfigurable on-chip memory includes a plurality of scratch pads, each of the plurality of scratch pads configured to buffer data of a respective one of a plurality of processing units, a plurality of memory units, each of the plurality of memory units associated with a respective one of the plurality of scratch pads, a plurality of scratch pad controllers, each of the plurality of scratch pad controllers configured to control an associated memory unit and an associated scratch pad, and a global controller configured to control data exchange between a respective one of the plurality of memory units and a data bus.

According to some aspects, at least one of the plurality of memory units includes at least one memory bank.

According to some aspects, a first memory unit of the plurality of memory units operates so as to comprise a first area operating in the same manner as a first scratch pad associated with the first memory unit and a second area operating in a different manner from the first scratch pad.

According to some aspects, a clock frequency of the first area is the same as a clock frequency of the first scratch pad.

According to some aspects, a second memory unit of the plurality of memory units operates so as to comprise a third area operating in the same manner as a second scratch pad associated with the second memory unit and a fourth area operating in a different manner from the second scratch pad.

According to some aspects, a first ratio of the first area to the second area is different from a second ratio of the third area to the fourth area.

According to some aspects, the second area and the fourth area are shared by the plurality of the processing units.

According to some aspects of the disclosure, a system-on-chip having a reconfigurable on-chip memory mounted thereon, includes a plurality of processing units, and an on-chip memory comprising a plurality of dedicated areas and a common area for the plurality of processing units, each of the plurality of dedicated areas associated with a respective one of the plurality of processing units, wherein the size of at least one of the plurality of dedicated areas and the size of the common area change during runtime.

According to some aspects, the on-chip memory includes a plurality of scratch pads configured to exclusively buffer data of a respective one of the plurality of processing units, and a reconfigurable on-chip memory comprising a plurality of memory areas operating in the same manner as a respective one of the plurality of scratch pads, or a memory area operating in a different manner from the plurality of scratch pads, wherein a respective one dedicated area of the plurality of dedicated areas comprises a scratch pad associated with the respective one dedicated area and a memory area operating in the same manner as the scratch pad associated with the respective one dedicated area, and the common area comprises the memory area operating in the different manner.

According to some aspects, at least one of the processing units preforms at least one of deep-learning training or deep-learning inference tasks.

According to some aspects of the disclosure, a method of using a reconfigurable on-chip memory, includes assigning a first calculation task to a first processing unit, obtaining a first path control signal according to the first calculation task, wherein the first path control signal indicates an interface to be used to transmit or receive first data for the first calculation task, reading or writing the first data from or onto an on-chip memory by using a first address system when the first path control signal indicates using a first interface, and reading or writing the first data from or onto the on-chip memory by using a second address system different from the first address system when the first path control signal indicates using a second interface.

According to some aspects, the method of using a reconfigurable on-chip memory, further includes receiving tasks and classifying the tasks into the first calculation task and a second calculation task, and assigning the second calculation task to a second processing unit different from the first processing unit.

According to some aspects, the method of using a reconfigurable on-chip memory, further includes obtaining a second path control signal according to the second calculation task, wherein the second path control signal indicates an interface to be used to transmit or receive second data for the second calculation task, reading or writing the second data from or onto the on-chip memory by using a third address system when the second path control signal indicates using a first interface, reading or writing the second data from or onto the on-chip memory by using the second address system when the second path control signal indicates using a second interface.

According to some aspects, the first address system is used exclusively for the first processing unit, and the third address system is used exclusively for the second processing unit.

According to some aspects, the second address system is commonly applied to the first and second processing units.

Aspects of the disclosure are not limited to those mentioned above, and other objects and advantages of the disclosure that have not been mentioned can be understood by the following description, and will be more clearly understood by embodiments of the disclosure. In addition, it will be readily understood that the objects and advantages of the disclosure can be realized by the means and combinations thereof set forth in the claims.

The reconfigurable on-chip memory bank, the reconfigurable on-chip memory, the system-on-chip having the same mounted thereon, and the method of using the reconfigurable on-chip memory of the disclosure can change the configuration of the on-chip memory during runtime, and thus, can extract performance optimized for the characteristics of calculation tasks.

In addition, as the size of the memory used in the scratch pad method provided for each processing unit is supported differently, an optimized memory size according to the characteristics of calculation tasks for each processing unit can be secured.

In addition to the foregoing, the specific effects of the disclosure will be described together while elucidating the specific details for carrying out the embodiments below.

DETAILED DESCRIPTION OF THE PREFERRED EMBODIMENTS

Figure 1:
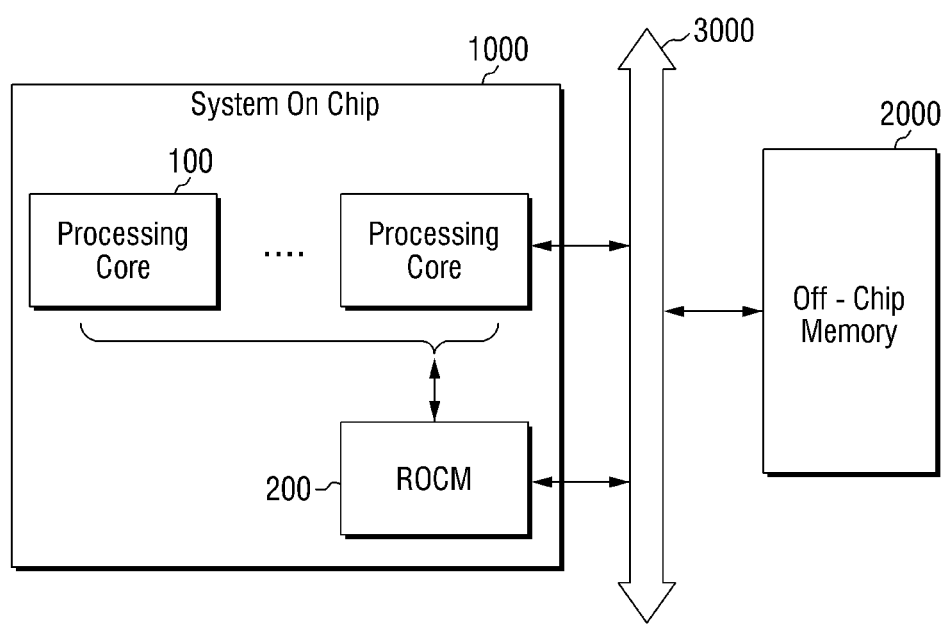
FIG. 1 is a conceptual diagram for illustrating a system-on-chip having a reconfigurable on-chip memory mounted thereon in accordance with some embodiments of the disclosure.

The terms or words used in the disclosure and the claims should not be construed as limited to their ordinary or lexical meanings. They should be construed as the meaning and concept in line with the technical idea of the disclosure based on the principle that the inventor can define the concept of terms or words in order to describe his/her own embodiments in the best possible way. Further, since the embodiment described herein and the configurations illustrated in the drawings are merely one embodiment in which the disclosure is realized and do not represent all the technical ideas of the disclosure, it should be understood that there may be various equivalents, variations, and applicable examples that can replace them at the time of filing this application.

Although terms such as first, second, A, B, etc. used in the description and the claims may be used to describe various components, the components should not be limited by these terms. These terms are used only for the purpose of distinguishing one component from another. For example, a first component may be referred to as a second component, and similarly, a second component may be referred to as a first component, without departing from the scope of the disclosure. The term 'and/or' includes a combination of a plurality of related listed items or any item of the plurality of related listed items.

The terms used in the description and the claims are merely used to describe particular embodiments and are not intended to limit the disclosure. Singular expressions include plural expressions unless the context explicitly indicates otherwise. In the application, terms such as "comprise", "have", "include", "contain", etc. should be understood as not precluding the possibility of existence or addition of features, numbers, steps, operations, components, parts, or combinations thereof described herein.

Unless otherwise defined, the phrases "A, B, or C," "at least one of A, B, or C," or "at least one of A, B, and C" may refer to only A, only B, only C, both A and B, both A and C, both B and C, all of A, B, and C, or any combination thereof.

Unless otherwise defined, all terms used herein, including technical or scientific terms, have the same meaning as commonly understood by those of ordinary skill in the art to which the disclosure pertains.

Terms such as those defined in commonly used dictionaries should be construed as having a meaning consistent with the meaning in the context of the relevant art, and are not to be construed in an ideal or excessively formal sense unless explicitly defined in the disclosure.

In addition, each configuration, procedure, process, method, or the like included in each embodiment of the disclosure may be shared to the extent that they are not technically contradictory to each other.

Hereinafter, a system-on-chip having a reconfigurable on-chip memory mounted thereon in accordance with some embodiments of the disclosure will be described with reference to FIGS. 1 to 14.

FIG. 1 is a conceptual diagram for illustrating a system-on-chip having a reconfigurable on-chip memory mounted thereon in accordance with some embodiments of the disclosure.

Referring to FIG. 1, a system-on-chip (SoC) 1000 having a reconfigurable on-chip memory mounted thereon in accordance with some embodiments of the disclosure includes a plurality of processing cores 100 and a reconfigurable on-chip memory 200. The system-on-chip 1000 may exchange data with an off-chip memory 2000 via a data bus 3000.

The processing cores 100 may be arranged inside the system-on-chip 1000. The processing cores 100 may receive and perform calculation tasks. The number of processing cores 100 may be two or more, as shown in FIG. 1. However, the embodiment is not limited thereto. If there are a plurality of processing cores 100, calculation tasks may be divided and executed. In this case, different amounts and different types of tasks may be performed by each processing core 100.

The reconfigurable on-chip memory (ROCM) 200 may be located inside the system-on-chip 1000. The reconfigurable on-chip memory 200 may receive programs, data, and instructions needed for calculation tasks via the off-chip memory 2000 and provide them to the processing cores 100. In addition, the reconfigurable on-chip memory 200 may receive and temporarily store the result data calculated by the processing cores 100, and transmit them to the off-chip memory 2000. That is, the reconfigurable on-chip memory 200 may serve as a buffer for the processing cores 100.

The off-chip memory 2000 may be installed at a location separated from the system-on-chip 1000. The off-chip memory 2000 may transmit or receive data to or from the system-on-chip 1000 via the data bus 3000. The off-chip memory 2000 may include, for example, at least one of dynamic random-access memory (DRAM), NAND flash memory, NOR flash memory, or 3D cross-point memory. However, the embodiment is not limited thereto.

The data bus 3000 may connect the off-chip memory 2000 and the reconfigurable on-chip memory 200 to each other. The data bus 3000 may connect the processing core 100 and the reconfigurable on-chip memory 200 to each other. Further, the data bus 3000 may also be used for data exchange between the system-on-chip 1000 and other chips. The data bus 3000 may serve as a path for exchanging data.

Figure 2:
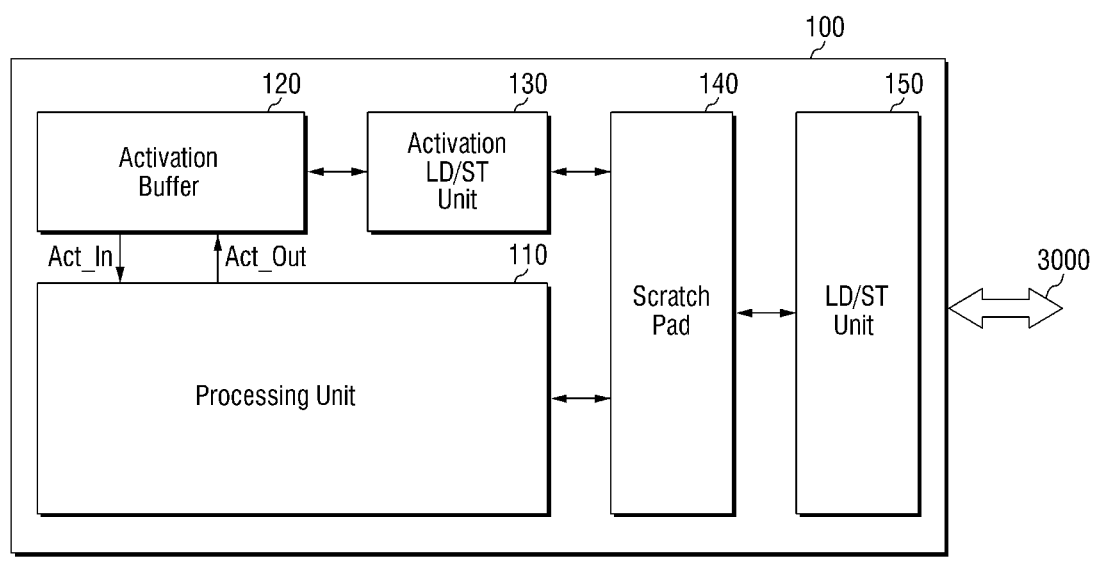
FIG. 2 is a block diagram for illustrating in detail the structure of the processing core of FIG. 1.

FIG. 2 is a block diagram for illustrating in detail the structure of the processing core of FIG. 1.

Referring to FIG. 2, the processing core 100 may include a processing unit 110, an activation buffer 120, an activation load/store unit 130, a scratch pad 140, and a load/store unit 150.

The processing unit 110 may perform calculations. The processing unit 110 can perform not only one-dimensional calculations but also two-dimensional matrix calculations, i.e., convolution calculations. The processing unit 110 may receive an input activation Act_In, multiply it by a weight, and then add it to generate an output activation Act_Out.

Figure 3:
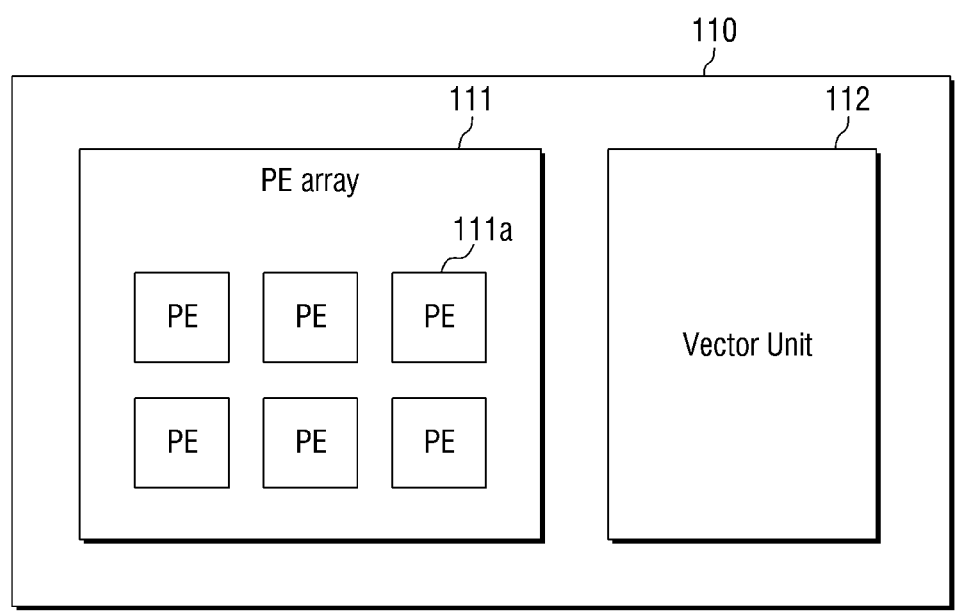
FIG. 3 is a block diagram for illustrating in detail the structure of the processing unit of FIG. 2.

FIG. 3 is a block diagram for illustrating in detail the structure of the processing unit of FIG. 2.

Referring to FIGS. 2 and 3, the processing unit 110 may include a PE array 111 and a vector unit 112.

The PE array 111 may receive input activations Act_In and multiply the input activations Act_In by weights, respectively. In this case, the input activations Act_In and the weights may form matrices and be calculated via convolution. Through this, the PE array 111 may generate an output activation Act_Out.

The PE array 111 may include at least one processing element 111a. The processing elements 111a may be aligned with each other and may each perform multiplication on one input activation Act_In and one weight.

The PE array 111 may generate a subtotal obtained by summing up values for each multiplication. This subtotal may be utilized as an output activation Act_Out. The PE array 111 performs two-dimensional matrix multiplication, and thus, may be referred to as a 2D matrix compute unit.

The vector unit 112 may mainly perform one-dimensional calculations. The vector unit 112, together with the PE array 111, may perform deep learning calculations. Through this, the processing unit 110 may be specialized for necessary calculations. In other words, the processing core 100 has calculation modules, respectively, that perform a large amount of two-dimensional matrix multiplications and one-dimensional calculations, and thus, can efficiently perform deep learning tasks.

Figure 4:
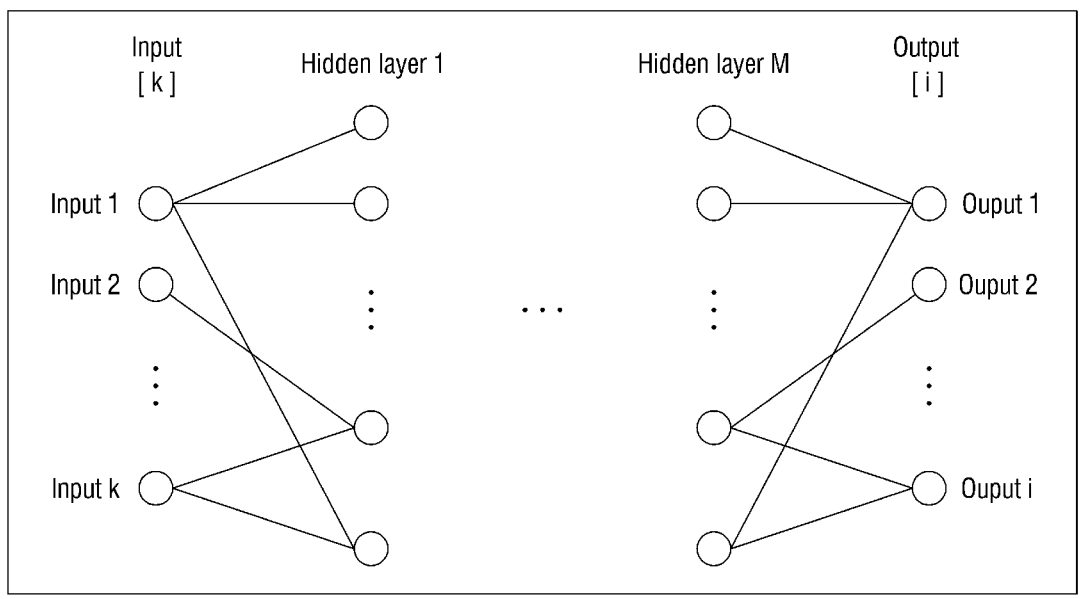
FIG. 4 is a conceptual diagram for illustrating the structure of a neural network for a deep learning task executed by the processing unit.

FIG. 4 is a conceptual diagram for illustrating the structure of a neural network of a deep learning task executed by the processing unit.

Referring to FIG. 4, the neural network implemented by the PE array 111 may include an input layer including input nodes Input 1 to Input k that receive input data, an output layer Output 1 to Output i including output nodes that output data, and M hidden layers arranged between the input layer and the output layer, where k, I, and M are integers greater than or equal to 1.

Here, weights may be set for the edges connecting the nodes of the respective layers. The presence or absence of such weights or edges may be added, removed, or updated during the training phase. Accordingly, through the training phase, the weights of the nodes and edges arranged between the k input nodes and the i output nodes may be updated.

All the nodes and edges may be set to initial values before the neural network performs training. However, if information is inputted cumulatively, the weights of the nodes and edges may be changed, and matching may be made between parameters inputted as training factors and values assigned to the output nodes in this process.

Further, the weights of the nodes and edges between the input nodes and output nodes constituting the neural network may be updated by the training phase of the neural network. The neural network may be, for example, but not limited to, at least one of Artificial Neural Network (ANN), Single Layer Perceptron (SLP), Multi-Layer Perceptron (MLP), Deep Neural Network (DNN), Recurrent Neural Network (RNN), Convolution Neural Network (CNN), or Long Short-Term Memory (LSTM).

Referring to FIG. 2 again, the activation buffer 120 may provide the input activation Act_In to the processing unit 110 and receive the output activation Act_Out from the processing unit 110. The activation buffer 120 may temporarily store the input activation Act_In and the output activation Act_Out.

The input activation Act_In and the output activation Act_Out may refer to input values and output values of the layers of the neural network. In this case, if there are a plurality of layers in the neural network, the output value of the previous layer becomes the input value of the next layer, and thus, the output activation Act_Out of the previous layer may be utilized as the input activation Act_In of the next layer.

The activation buffer 120 may quickly provide the activation to the processing unit 110, in particular, the PE array 111, which has a large amount of calculation, and may quickly receive the activation, thereby increasing the calculation speed of the processing core 100.

The activation load/store unit 130 may pass the input activation Act_In from the scratch pad 140 on to the activation buffer 120, and pass the output activation Act_Out from the activation buffer 120 on to scratch pad 140. In other words, the activation load/store unit 130 may perform both the load task and store task of the activation.

The scratch pad 140 is a memory located inside the processing core 100, and may receive and temporarily store all the input data needed for the tasks by the processing core 100 from the outside. Further, the scratch pad 140 may temporarily store the output data calculated by the processing core 100 for transmission to the outside.

The scratch pad 140 may transmit the input activation Act_In to the activation buffer 120 and receive the output activation Act_Out, by means of the activation load/store unit 130. The scratch pad 140 may transmit or receive data directly to or from the processing unit 110, in addition to the activation load/store unit 130. That is, the scratch pad 140 may exchange data with each of the PE array 111 and the vector unit 112.

The load/store unit 150 may receive at least one of input data, a program, or a control signal from the outside via an external interface 300. The load/store unit 150 may transmit at least one of the received input data, program, or control signal to the scratch pad 140.

Similarly, the load/store unit 150 may pass output data on to the outside via the external interface 300. The load/store unit 150 may transmit the output data generated by the processing unit 110.

Figure 5:
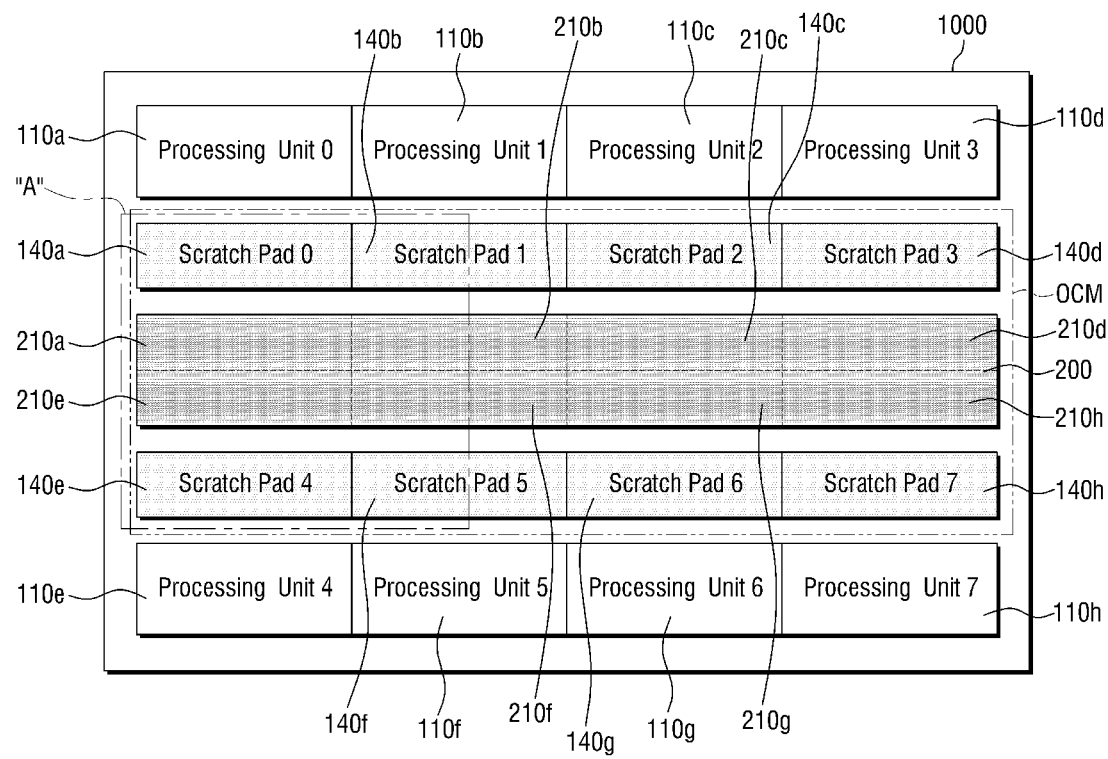
FIG. 5 is a conceptual diagram for illustrating the structure of the on-chip memory of the system-on-chip of FIG. 1.

FIG. 5 is a conceptual diagram for illustrating the structure of the on-chip memory of the system-on-chip of FIG. 1.

Referring to FIG. 5, the system-on-chip 1000 may include first to eighth processing units 110a to 110h and an on-chip memory OCM. Although FIG. 5 illustrates eight processing units as an example, this is merely illustrative and the number of processing units may vary as desired.

The on-chip memory OCM may include first to eighth scratch pads 140a to 140h and a reconfigurable on-chip memory 200.

The first to eighth scratch pads 140a to 140h may be used as private memories for the first to eighth processing units 110a to 110h, respectively. In other words, the first to eighth processing units 110a to 110h may correspond to the first to eighth scratch pads 140a to 140h, respectively.

The reconfigurable on-chip memory 200 may include first to eighth memory units 210a to 210h. The first to eighth memory units 210a to 210h may correspond to the first to eighth processing units 110a to 110h, respectively, and may correspond to the first to eighth scratch pads 140a to 140h, respectively. That is, the number of memory units may be eight, which is equal to the number of processing units and scratch pads.

The reconfigurable on-chip memory 200 may operate in one of two on-chip memory types. That is, the reconfigurable on-chip memory 200 may operate in a scratch pad type or a shared memory type. In other words, the reconfigurable on-chip memory 200 may realize two types of logical memories with one piece of hardware.

If the reconfigurable on-chip memory 200 is implemented in the scratch pad type, the reconfigurable on-chip memory 200 may operate as a private memory for each of the first to eighth processing units 110a to 110h, just like the first to eighth scratch pads 140a to 140h. The scratch pad can operate at a relatively higher clock speed compared to the shared memory, and the reconfigurable on-chip memory 200 may also use a relatively higher clock speed when operating in the scratch pad type.

If the reconfigurable on-chip memory 200 is implemented in the shared memory type, the reconfigurable on-chip memory 200 may operate as a common memory shared by the first processing unit 110a and the second processing unit 110b. In this case, the reconfigurable on-chip memory 200 may be shared not only by the first to eighth processing units 110a to 110h but also by the first to eighth scratch pads 140a to 140h.

The shared memory may generally use a lower clock compared to the scratch pad, but is not limited thereto. When the reconfigurable on-chip memory 200 operates in the shared memory type, the first to eighth processing units 110a to 110h may share the reconfigurable on-chip memory 200. In this case, the reconfigurable on-chip memory 200 may be operably coupled with the off-chip memory 2000 via the data bus 3000, and may operate as a buffer for the off-chip memory 2000 as well.

The reconfigurable on-chip memory 200 may operate at least in part in the scratch pad type, and the rest may operate in the shared memory type. That is, the entire reconfigurable on-chip memory 200 may operate in the scratch pad type, or the entire reconfigurable on-chip memory 200 may operate in the shared memory type. Alternatively, a part of the reconfigurable on-chip memory 200 may operate in the scratch pad type, and the rest may operate in the shared memory type.

FIGS. 6 to 12 are diagrams for illustrating the form of a reconfigurable on-chip memory of a system-on-chip having the reconfigurable on-chip memory mounted thereon in accordance with some embodiments of the disclosure.

Figure 6:
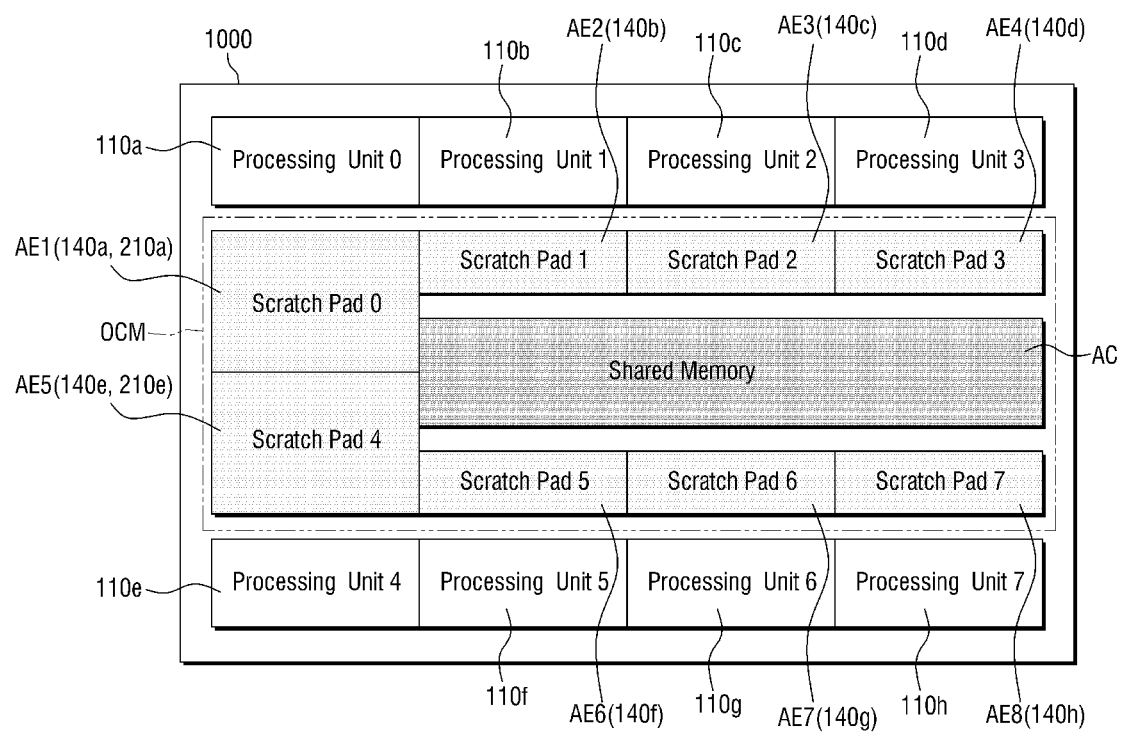
FIG. 6 is a diagram for illustrating the form of a reconfigurable on-chip memory of a system-on-chip having the reconfigurable on-chip memory mounted thereon in accordance with some embodiments of the disclosure.

Referring to FIGS. 5 and 6, the first processing unit 110a may use a first dedicated area AE1 of the on-chip memory OCM as the scratch pad type. The fifth processing unit 110e may use a fifth dedicated area AE5 of the on-chip memory OCM as the scratch pad type.

In this case, the first dedicated area AE1 may operate as a private memory for the first processing unit 110a, and the fifth dedicated area AE5 may operate as a private memory for the fifth processing unit 110e. The common area AC may be a memory shared by the first to eighth processing units 110a to 110h.

The first dedicated area AE1 may include the first scratch pad 140a and the first memory unit 210a of FIG. 5. The first dedicated area AE1 may be an area in which the first scratch pad 140a and the first memory unit 210a that are separated hardware-wise operate in the same manner and operate logically as one scratch pad memory.

The fifth dedicated area AE5 may include the fifth scratch pad 140e and the fifth memory unit 210e of FIG. 5. The fifth dedicated area AE5 may be an area in which the fifth scratch pad 140e and the fifth memory unit 210e that are separated hardware-wise operate in the same manner and operate logically as one scratch pad memory.

The common area AC may be a memory area shared by the first to eighth processing units 110a to 110h. FIG. 6 illustrates a case in which the common area AC is formed by the memory units other than the first memory unit 210a and the fifth memory unit 210e. Referring to FIG. 6, the first memory unit 210a and the fifth memory unit 210e may be implemented in the scratch pad type, and the second to fourth memory units 210b to 210d and the sixth to eighth memory units 210f to 210h may be implemented as the shared memory corresponding to the common area AC.

The reconfigurable on-chip memory 200 in accordance with the embodiment may convert an area corresponding to each processing unit into a logical scratch pad and a logical shared memory of an optimized ratio and use them. The reconfigurable on-chip memory 200 may adjust this ratio at runtime. Each processing unit may perform the same task in some cases, but may perform different tasks in other cases as well. In this case, the amount of the scratch pad and the amount of the shared memory required for the tasks carried out by each processing unit are inevitably different each time.

Accordingly, if the composition ratio of the scratch pad and the shared memory is fixedly set as in the conventional on-chip memory, an inefficiency may occur due to the calculation tasks assigned to each processing unit.

In contrast, the reconfigurable on-chip memory in accordance with the embodiment can set an optimal ratio of the scratch pad and the shared memory according to calculation tasks during the runtime, and can improve the efficiency and speed of calculation.

Figure 7:
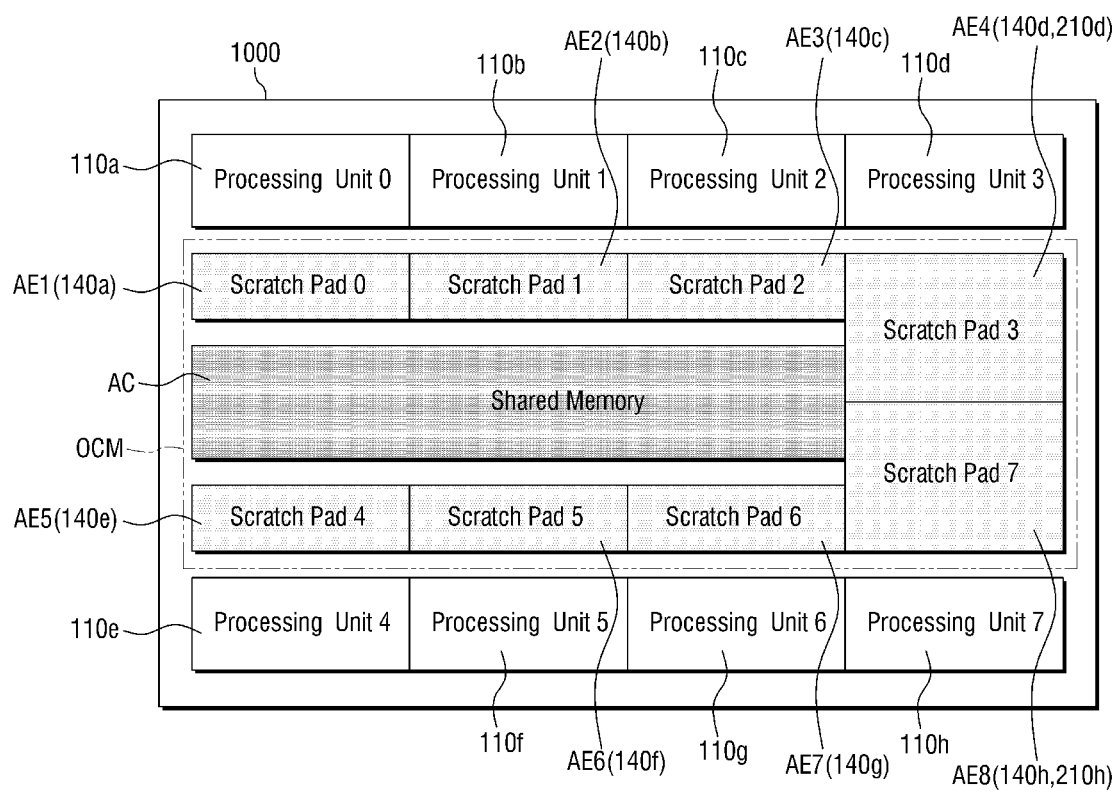
FIG. 7 is a diagram for illustrating the form of a reconfigurable on-chip memory of a system-on-chip having the reconfigurable on-chip memory mounted thereon in accordance with some embodiments of the disclosure.

Referring to FIGS. 5 and 7, the first to third and fifth to seventh dedicated areas AE1 to AE3 and AE5 to AE7 may be associated with the first to third and fifth to seventh processing units 110a to 110c and 110e to 110g, respectively, and may include only the first to third and fifth to seventh scratch pads 140a to 140c and 140e to 140g, respectively.

Further, the fourth dedicated area AE4 may include the fourth scratch pad 140d and the fourth memory area 210d. The eighth dedicated area AE8 may include the eighth scratch pad 140h and the eighth memory area 210h. The first to third and fifth to seventh memory units 210a to 210c and 210e to 210g of the reconfigurable on-chip memory 200 may be utilized as the common area AC.

Figure 8:
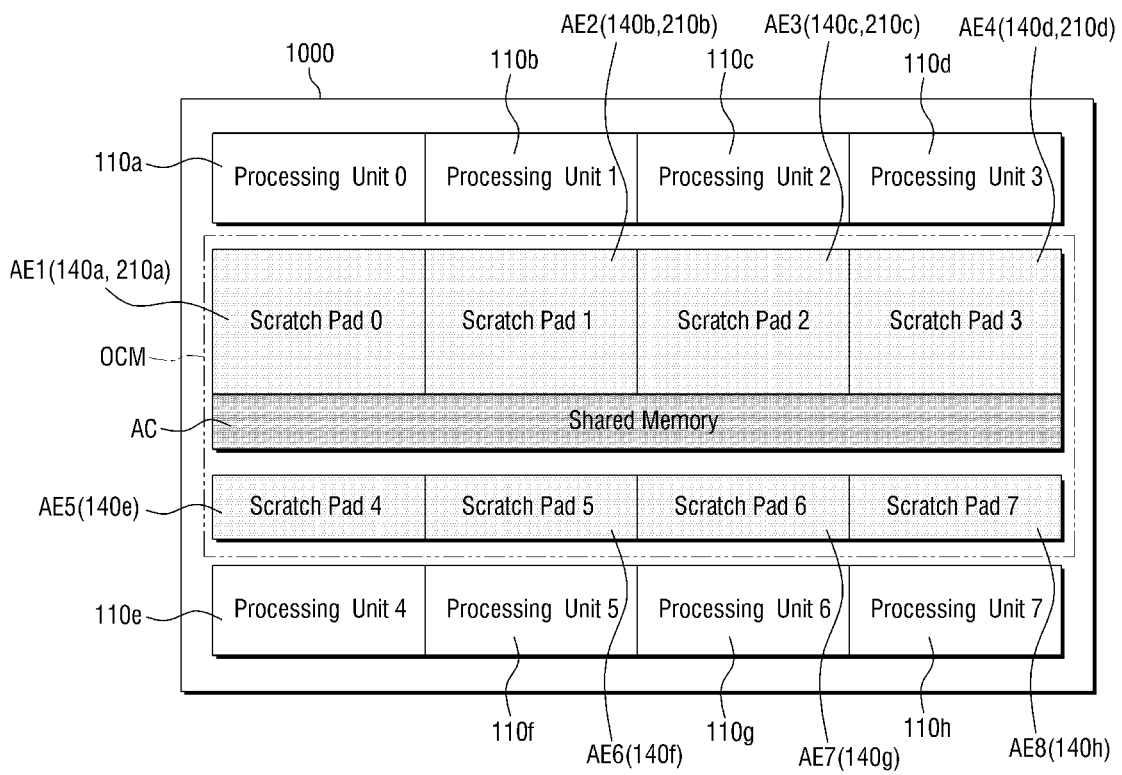
FIG. 8 is a diagram for illustrating the form of a reconfigurable on-chip memory of a system-on-chip having the reconfigurable on-chip memory mounted thereon in accordance with some embodiments of the disclosure.

Referring to FIGS. 5 and 8, the first to fourth dedicated areas AE1 to AE4 may be associated with the first to fourth processing units 110a to 110d, respectively, and may include the first to fourth scratch pads 140a to 140d, respectively. In addition, the first to fourth dedicated areas AE1 to AE4 may include the first to fourth memory units 210a to 210d, respectively.

The fifth to eighth dedicated areas AE5 to AE8 may be associated with the fifth to eighth processing units 110e to 110h, respectively, and may include only the fifth to eighth scratch pads 140f to 140h, respectively. The fifth to eighth memory units 210e to 210h of the reconfigurable on-chip memory 200 may be utilized as shared memories.

Figure 9:
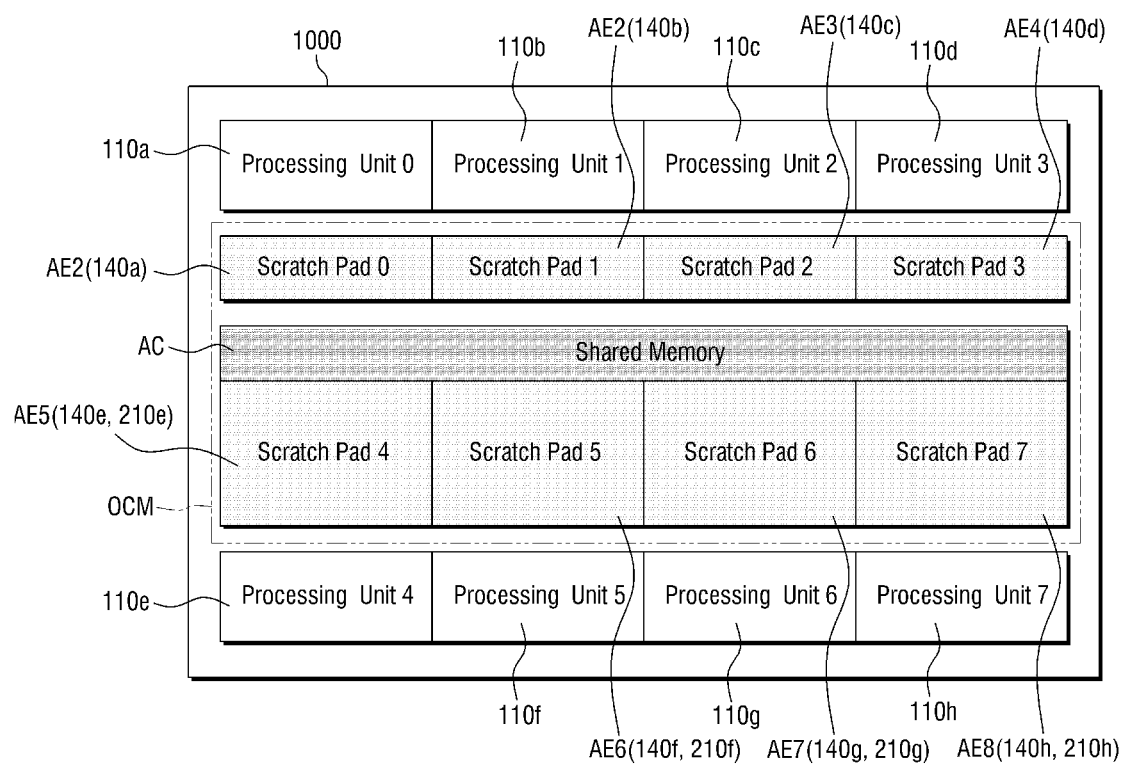
FIG. 9 is a diagram for illustrating the form of a reconfigurable on-chip memory of a system-on-chip having the reconfigurable on-chip memory mounted thereon in accordance with some embodiments of the disclosure.

Referring to FIGS. 5 and 9, the first to fourth dedicated areas AE1 to AE4 may be associated with the first to fourth processing units 110a to 110d, respectively, and may include only the first to fourth scratch pads 140a to 140d, respectively. In addition, the fifth to eighth dedicated areas AE5 to AE8 may be associated with the fifth to eighth processing units 110e to 110h, respectively, and may include the fifth to eighth scratch pads 140e to 140h, respectively. The fifth to eighth dedicated areas AE5 to AE8 may further include fifth to eighth memory units 210e to 210h, respectively. The first to fourth memory units 210a to 210d of the reconfigurable on-chip memory 200 may be utilized as shared memories.

Figure 10:
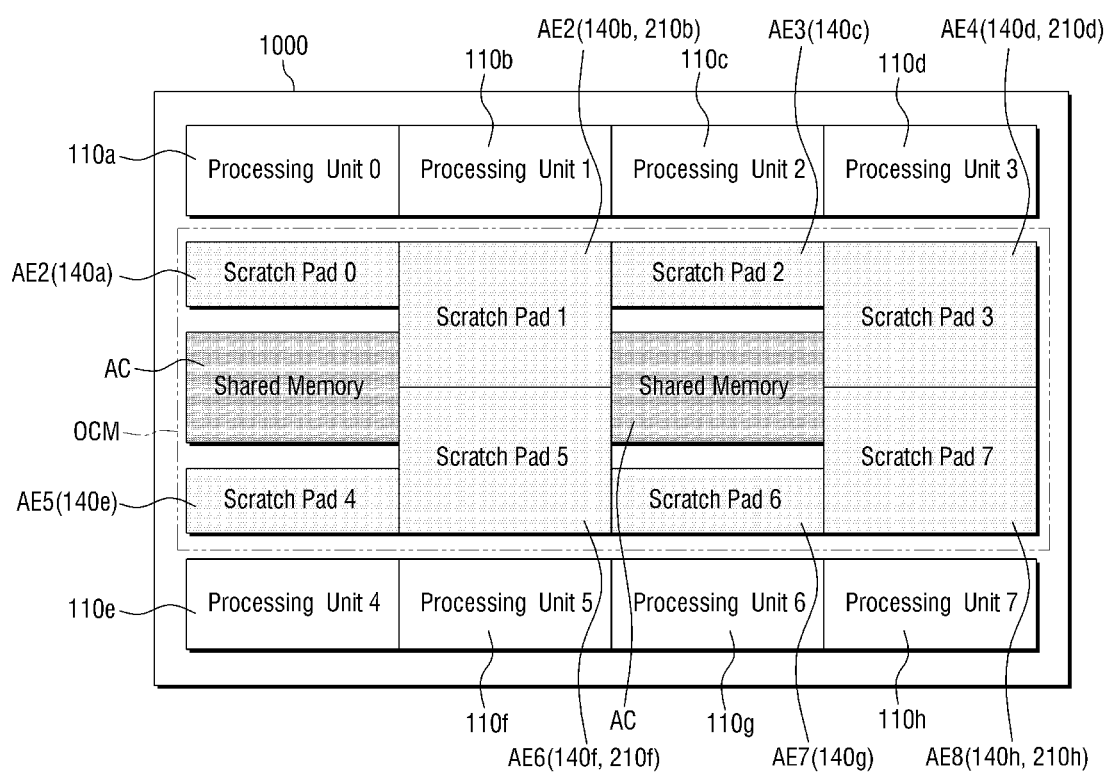
FIG. 10 is a diagram for illustrating the form of a reconfigurable on-chip memory of a system-on-chip having the reconfigurable on-chip memory mounted thereon in accordance with some embodiments of the disclosure.

Referring to FIGS. 5 and 10, the first, third, fifth, and seventh dedicated areas AE1, AE3, AE5, and AE7 may be associated with the first, third, fifth, and seventh processing units 110a, 110c, 110e, and 110g, respectively, and may include only the first, third, fifth, and seventh scratch pads 140a, 140c, 140e, and 140g, respectively. Further, the second, fourth, sixth, and eighth dedicated areas AE2, AE4, AE6, and AE8 may be associated with the second, fourth, sixth, and eighth processing units 110b, 110d, 110f, and 110h, respectively, and may include the second, fourth, sixth, and eighth scratch pads 140b, 140d, 140f, and 140h, respectively. In addition, the second, fourth, sixth, and eighth dedicated areas AE2, AE4, AE6, and AE8 may include the second, fourth, sixth, and eighth memory units 210b, 210d, 210f, and 210h. The first, third, fifth, and seventh memory units 210a, 210c, 210e, and 210g of the reconfigurable on-chip memory 200 may be utilized as shared memories.

Figure 11:
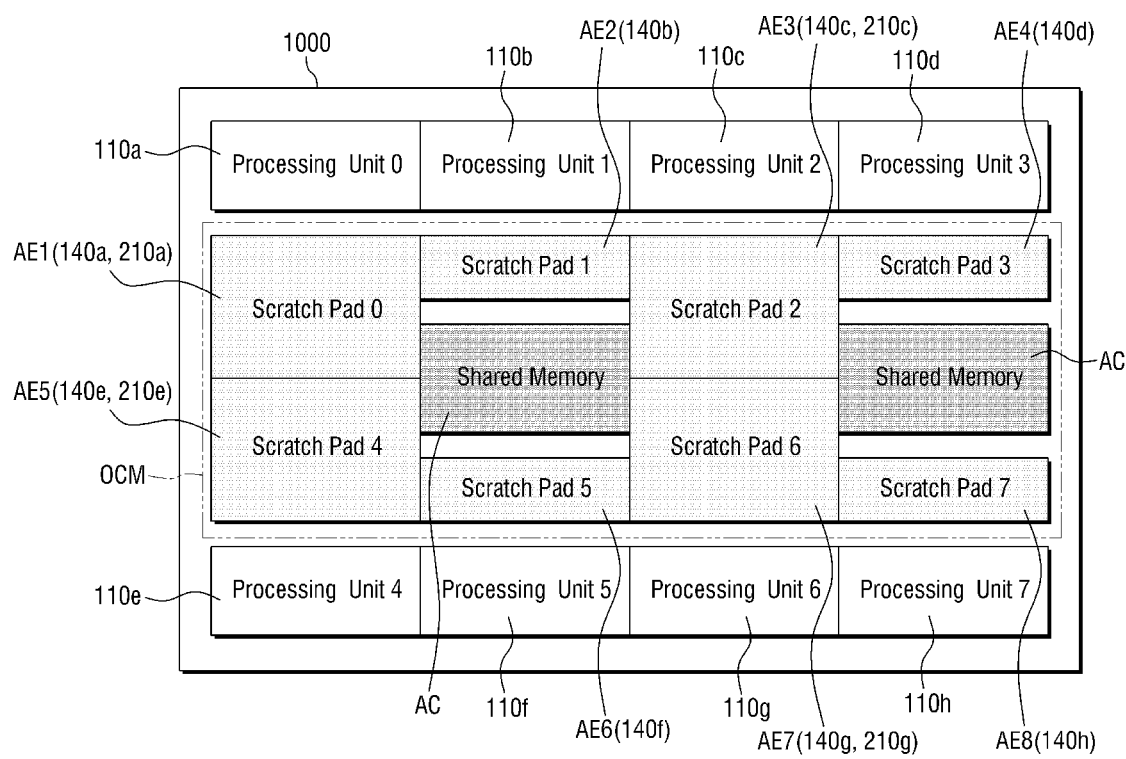
FIG. 11 is a diagram for illustrating the form of a reconfigurable on-chip memory of a system-on-chip having the reconfigurable on-chip memory mounted thereon in accordance with some embodiments of the disclosure.

Referring to FIGS. 5 and 11, the first, third, fifth, and seventh dedicated areas AE1, AE3, AE5, and AE7 may be associated with the first, third, fifth, and seventh processing units 110a, 110c, 110e, and 110g, respectively, and may include first, third, fifth, and seventh scratch pads 140a, 140c, 140e, and 140g, respectively. The first, third, fifth, and seventh dedicated areas AE1, AE3, AE5, and AE7 may further include first, third, fifth, and seventh memory units 210a, 210c, 210e, and 210g, respectively.

The second, fourth, sixth, and eighth dedicated areas AE2, AE4, AE6, and AE8 may be associated with the second, fourth, sixth, and eighth processing units 110b, 110d, 110f, and 110h, respectively, and may include only the second, fourth, sixth, and eighth scratch pads 140b, 140d, 140f, and 140h, respectively. The second, fourth, sixth, and eighth memory units 210b, 210d, 210f, and 210h of the reconfigurable on-chip memory 200 may be utilized as shared memories.

Figure 12:
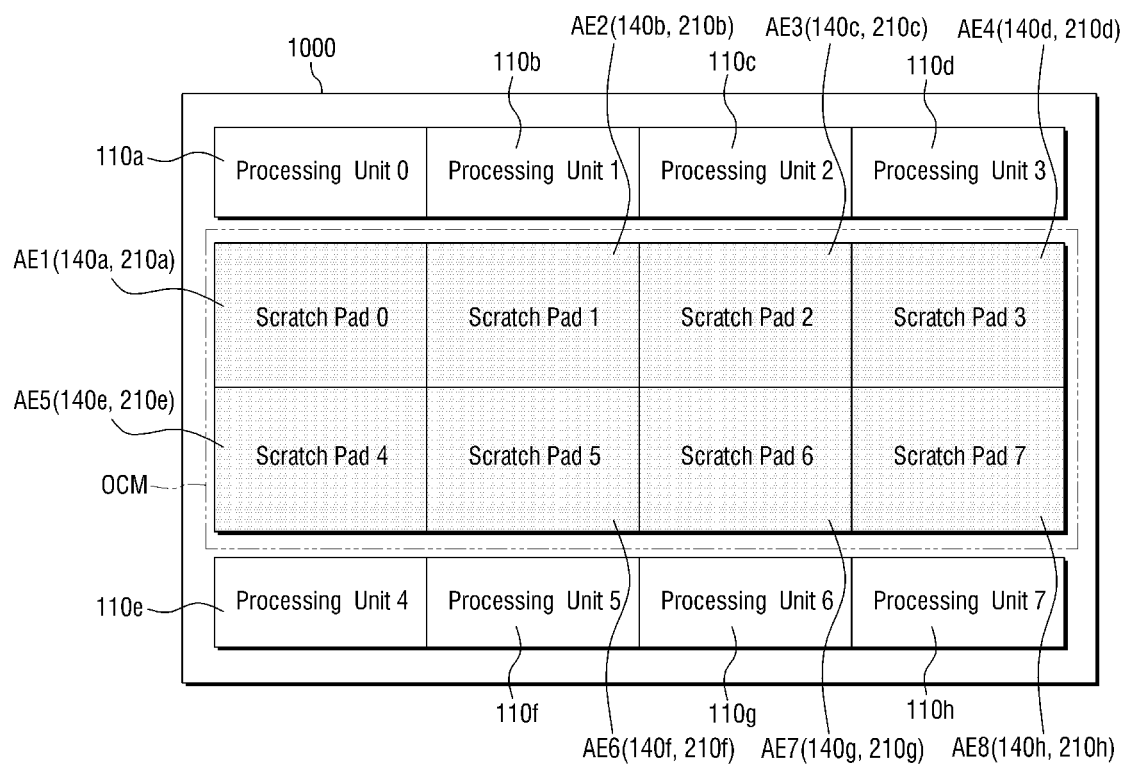
FIG. 12 is a diagram for illustrating the form of a reconfigurable on-chip memory of a system-on-chip having the reconfigurable on-chip memory mounted thereon in accordance with some embodiments of the disclosure.

Referring to FIGS. 5 and 12, the first to eighth dedicated areas AE1 to AE8 may be associated with the first to eighth processing units 110a to 110h, respectively, and may include the first to eighth scratch pads 140a to 140h, respectively. In addition, the first to eighth dedicated areas AE1 to AE8 may further include the first to eighth memory units 210a to 210h, respectively.

As such, in the reconfigurable on-chip memory in accordance with some embodiments of the disclosure, the sizes of the first to eighth dedicated areas AE1 to AE8 and the common area AC may change during runtime.

Figure 13:
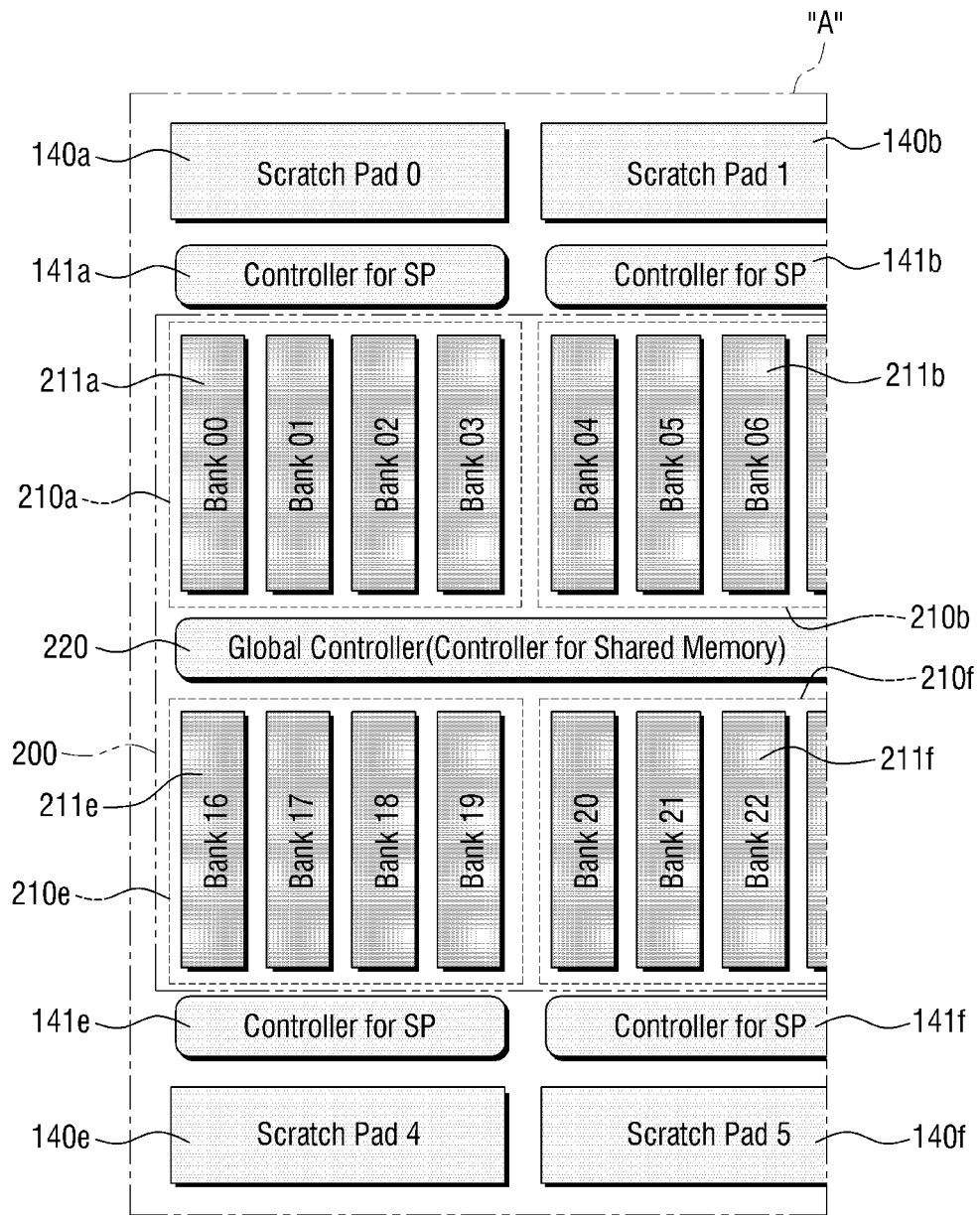
FIG. 13 is a conceptual diagram for illustrating in detail the structure of portion A of FIG. 5.

FIG. 13 is a conceptual diagram for illustrating in detail the structure of portion A of FIG. 5.

Referring to FIGS. 5 and 13, the reconfigurable on-chip memory 200 may include a first scratch pad controller 141a, a second scratch pad controller 141b, a fifth scratch pad controller 141e, a sixth scratch pad controller 141f, first to eighth memory units 210a to 210h, and a global controller 220. The reconfigurable on-chip memory 200 may also include other scratch pad controllers not shown, but they are omitted for convenience.

The first scratch pad controller 141a may control the first scratch pad 140a. Further, the first scratch pad controller 141a may control the first memory unit 210a. Specifically, when the first memory unit 210a is implemented in a logical scratch pad type, the first scratch pad controller 141a may control the first memory unit 210a.

The second scratch pad controller 141b may control the second scratch pad 140b. Further, the second scratch pad controller 141b may control the second memory unit 210b. In other words, when the second memory unit 210b is implemented in the logical scratch pad type, the first scratch pad controller 141a may control the second memory unit 210b.

The fifth scratch pad controller 141e may control the fifth scratch pad 140e. Further, the fifth scratch pad controller 141e may control the fifth memory unit 210e. In other words, when the fifth memory unit 210e is implemented in the logical scratch pad type, the fifth scratch pad controller 141e may control the fifth memory unit 210e.

The sixth scratch pad controller 141f may control the sixth scratch pad 140f. Further, the sixth scratch pad controller 141f may control the sixth memory unit 210f. In other words, when the sixth memory unit 210f is implemented in the logical scratch pad type, the sixth scratch pad controller 141f may control the sixth memory unit 210f.

The global controller 220 may control all of the first to eighth memory units 210a to 210h. Specifically, the global controller 220 may control, among the first memory unit 210a to the eighth memory unit 210h, one or more memory units that operate logically in the shared memory type and do not operate logically in the scratch pad type).

In other words, the first to eighth memory units 210a to 210h may be controlled by the first to eighth scratch pad controllers 141a to 141h, respectively, or may be controlled by the global controller 220, depending on what type of memory they are logically implemented in.

If the scratch pad controllers including the first, second, fifth, and sixth scratch pad controllers 141a, 141b, 141e, and 141f control the first to eighth memory units 210a to 210h, respectively, the first to eighth scratch pad controllers 141a to 141h may control the first to eighth memory units 210a to 210h in the same manner as the first to eighth scratch pad controllers 141a to 141h control the first to eighth scratch pads 140a to 140h, and thus, can control them as the private memory of the first to eighth processing units 110a to 110h. Accordingly, the first to eighth memory units 210a to 210h may operate at clock frequencies corresponding to the clock frequencies of the first to eighth processing units 110a to 110h, respectively.

Each of scratch pad controllers including the first scratch pad controller 141a, the second scratch pad controller 141b, the fifth scratch pad controller 141e, and the sixth scratch pad controller 141f may include the load/store unit 150 of the processing core 100 in FIG. 2.

If the global controller 220 controls at least one of the first to eighth memory units 210a to 210h, then the global controller 220 may control the at least one of the first to eighth memory units 210a to 210h as the common memories of the first to eighth processing units 110a to 110h. Accordingly, the at least one of the first to eighth memory units 210a to 210h may operate at a clock frequency independent of the clock frequencies of the first to eighth processing units 110a to 110h, respectively. However, the embodiment is not limited thereto.

The global controller 220 may connect the first to eighth memory units 210a to 210h with the data bus 3000 of FIG. 1. The first to eighth memory units 210a to 210h may exchange data with the off-chip memory 2000 of FIG. 1 or may exchange data with the first to eighth scratch pads 140a to 140h, respectively, by means of the global controller.

Each of the first to eighth memory units 210a to 210h may include at least one memory bank. The first memory unit 210a may include at least one first memory bank 211a. The first memory banks 211a may be areas obtained by dividing the first memory unit 210a into certain sizes. All the first memory banks 211a may have the same size. However, the embodiment is not limited thereto. FIG. 13 illustrates that four memory banks are included in one memory unit for convenience.

Similarly, the second, fifth, and sixth memory units 210b, 210e, and 210f may include at least one second, fifth, and sixth memory banks 211b, 211e, and 211f, respectively.

In the following, the description will be made based on the first memory banks 211a and the fifth memory banks 211e, which may be the same as other memory banks including the second and sixth memory banks 211b and 211f.

Each of the first memory banks 211a may each operate logically in the scratch pad type or operate logically in the shared memory type. In this case, the first memory banks 211a may operate independently of the other memory banks in the first memory unit 210a. However, the embodiment is not limited thereto.

If each memory bank of the first memory banks 211a operates independently, the first memory unit 210a may include a first area operating in the same manner as the first scratch pad 140a and a second area operating in a different manner from the first scratch pad 140a. In this case, the first area and the second area do not necessarily coexist, but any one area may occupy the entire first memory unit 210a.

Likewise, the second memory unit 210b may include a third area operating in the same manner as the second scratch pad 140b and a fourth area operating in a different manner from the second scratch pad 140b. In this case, the third area and the fourth area do not necessarily coexist, but any one area may occupy the entire first memory unit 210a.

In this case, the ratio of the first area to the second area may be different from the ratio of the third area to the fourth area. However, the embodiment is not limited thereto. Therefore, the ratio of the first area to the second area may be the same as the ratio of the third area to the fourth area as well. In other words, the memory composition ratio in each memory unit may vary as desired.

In general, in the case of the conventional system-on-chip, the on-chip memory except for high-speed scratch pads often included high-density, low-power SRAM. This is because SRAM has a high efficiency in terms of chip area and power consumption relative to required capacity. However, with the conventional on-chip memory, the processing speed slowed down significantly inevitably in the case of tasks that require more data quickly than the predetermined capacity of the scratch pad, and even when the need for the shared memory is not great, there is no way to utilize the remaining shared memory, resulting in inefficiencies.

On the other hand, the reconfigurable on-chip memory 200 in accordance with some embodiments of the disclosure may be controlled selectively by any one of the two controllers, respectively, depending on the cases. In this case, the reconfigurable on-chip memory 200 may be controlled not only as a whole by a determined one of the two controllers but also independently for each memory unit or each memory bank.

Through this, the reconfigurable on-chip memory 200 in accordance with the embodiment can obtain an optimal memory composition ratio according to calculation tasks during the runtime and can perform faster and more efficient calculation tasks. In the case of a processing unit specialized in artificial intelligence, the required sizes of the scratch pad and shared memory may vary for each particular application. Moreover, even for the same application, the required sizes of the scratch pad and shared memory may vary for each layer when a deep learning network is used. In the reconfigurable on-chip memory 200 in accordance with the embodiment, the composition ratio of the memory can be changed during the runtime even when calculation steps change according to each layer, making fast and efficient deep learning tasks possible.

Figure 14:
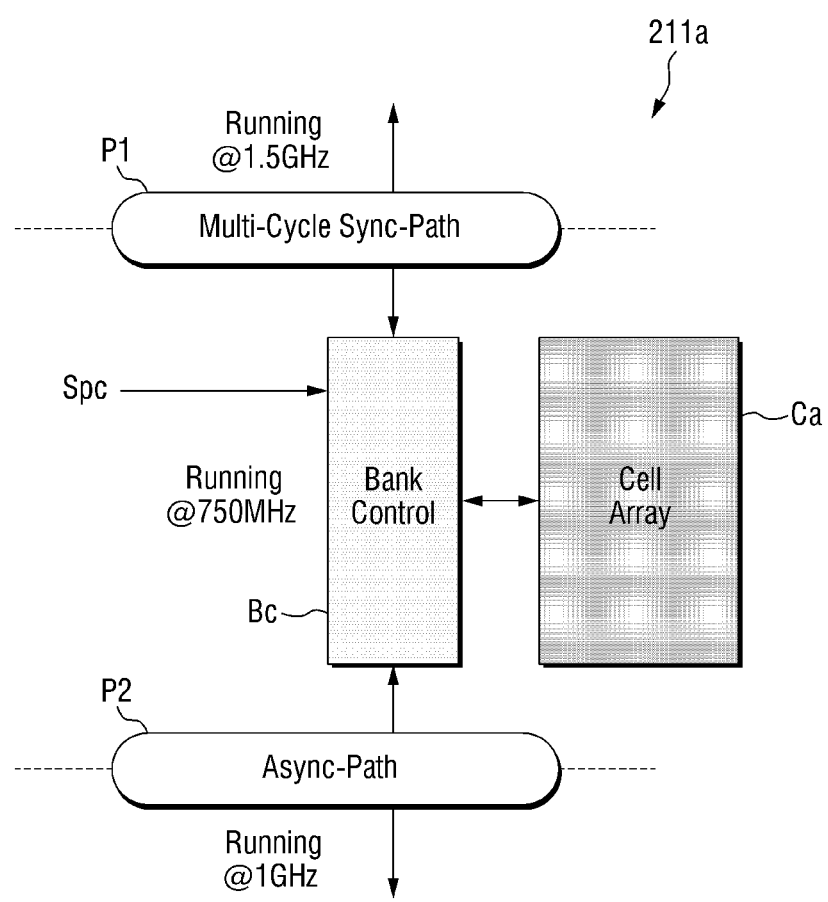
FIG. 14 is a block diagram for illustrating in detail the memory bank of FIG. 13.

FIG. 14 is a block diagram for illustrating in detail the memory bank of FIG. 13. Although FIG. 14 illustrates the first memory bank 211a, other memory banks may also have the same structure as the first memory bank 211a.

Referring to FIG. 14, the first memory bank 211a may include a cell array Ca, a bank controller Bc, a first path unit P1, and a second path unit P2.

The cell array Ca may include a plurality of memory devices (cells) therein. In the cell array Ca, the plurality of memory devices may be arranged in a lattice structure. The cell array Ca may be, for example, a SRAM (static random-access memory) cell array.

Figure 15:
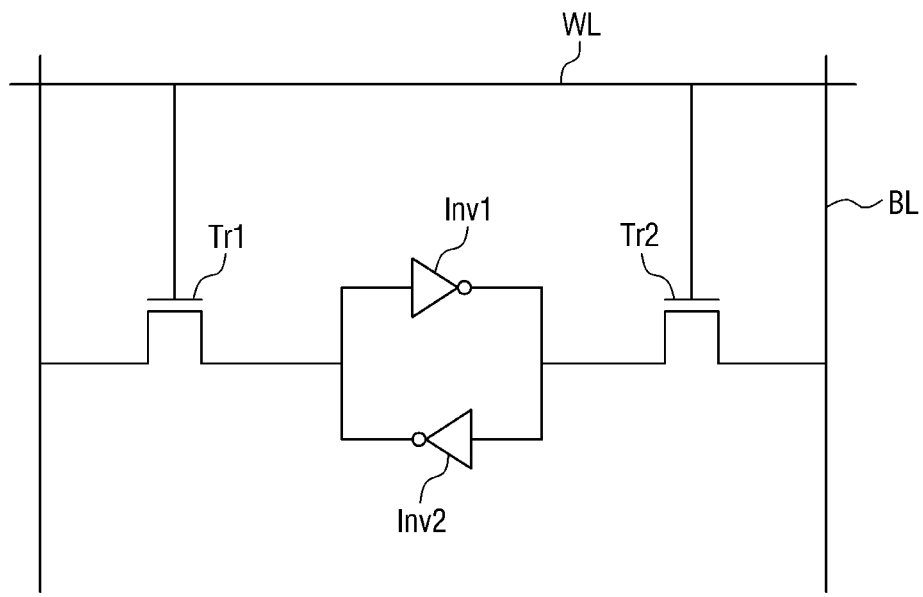
FIG. 15 is a circuit diagram for illustrating the cell array of FIG. 14.

FIG. 15 is a circuit diagram for illustrating the cell array of FIG. 14.

Referring to FIGS. 14 and 15, the cell array Ca may include a plurality of SRAM cells. Each SRAM cell may include a wordline WL, a bitline BL, a first transistor Tr1, a second transistor Tr2, a first inverter Inv1, and a second inverter Inv2.

The wordline WL may be a signal line for selecting a cell. That is, when a high (or low) signal is applied to the wordline WL, a corresponding cell may be selected. The bitline BL may be a line to which data are applied. When data are applied as high (or low) to the bitline BL, high (or low) data may be stored in the SRAM cell.

The first transistor Tr1 and the second transistor Tr2 may operate according to the signal applied to the wordline WL, and may serve as a switch for passing the data of the bitline BL therethrough. The first inverter Inv1 and the second inverter Inv2 may be connected in series and store data applied via the bitline BL. The first inverter Inv1 may invert output data of the second inverter Inv2, and the second inverter Inv2 may invert the output data of the first inverter Inv1, to store the original data.

In a write operation, the first transistor Tr1 and the second transistor Tr2 may be turned on through a high signal applied to the wordline WL, and the data of the bitline BL may be applied to the first inverter Inv1 and the second inverter Inv2. Thereafter, when a signal applied to the wordline WL changes from high to low, the first transistor Tr1 and the second transistor Tr2 may be turned off, and the data may be maintained through the two inverters.

In a read operation, the first transistor Tr1 and the second transistor Tr2 may be turned on through a high signal applied to the wordline WL, and the data stored in the first inverter Inv1 and the second inverter Inv2 may go out to the bitline BL and be read.

Referring to FIGS. 4, 13, and 14 again, the bank controller Bc may control the cell array Ca. The bank controller Bc may determine whether the cell array Ca operates in the scratch pad type or in the shared memory type, and may control the cell array Ca accordingly.

Specifically, the bank controller Bc may determine whether to transmit or receive data in the direction of the first path unit P1, or to transmit or receive data in the direction of the second path unit P2 during the runtime. The bank controller Bc may determine a data transmission and reception direction according to a path control signal Spc.

The path control signal Spc may be generated by a pre-designed device driver or compiler. The path control signal Spc may be generated according to the characteristics of calculation tasks. Alternatively, the path control signal Spc may be generated by an input received from a user. In other words, the user may directly apply an input to the path control signal Spc in order to select optimal memory composition ratio.

The bank controller Bc may determine, based on the path control signal Spc, a path along which the data stored in the cell array Ca are transmitted or received. The exchange interface of data may be changed as the bank controller Bc determines the path along which the data are transmitted or received. In other words, a first interface may be used when the bank controller Bc exchanges data with the first path unit P1, and a second interface may be used when the bank controller Bc exchanges data with the second path unit P2. In this case, the first interface and the second interface may be different from each other.

Also, address systems in which data are stored may vary as well. In other words, if a particular interface is selected, then read and write operations may be performed in an address system corresponding thereto.

The bank controller Bc may operate at a particular clock frequency. For example, if the cell array Ca is an SRAM cell array, the bank controller Bc may operate at the operating clock frequency of a general SRAM. Although it is shown at 750 MHz as an example in FIG. 14, the embodiment is not limited thereto.

The first path unit P1 may be operably coupled with the bank controller Bc. The first path unit P1 may directly exchange the data of the cell array Ca with the first processing unit 110a. In this case, "directly" may mean being exchanged with each other without going through the data bus 3000. In other words, the first processing unit 110a may exchange data directly with the first scratch pad 140a, and the first processing unit 110a may exchange data via the first path unit P1 when the reconfigurable on-chip memory 200 is implemented logically in the scratch pad type. The first path unit P1 may include scratch pad controllers including the first scratch pad controller 141a and the second scratch pad controller 141b of FIG. 13.

The first path unit P1 may form a multi-cycle sync-path. That is, the operating clock frequency of the first path unit P1 may be equal to the operating clock frequency of the first processing unit 110a. The first scratch pad 140a may quickly exchange data at the same clock frequency as the operating clock frequency of the first processing unit 110a in order to exchange data quickly at the same speed as the operation of the first processing unit 110a. The first path unit P1 may also operate at the same clock frequency as the operating clock frequency of the first processing unit 110a, likewise.

In this case, the operating clock frequency of the first path unit P1 may be multiples of the operating clock frequency of the bank controller Bc. In this case, a clock domain crossing (CDC) operation for synchronizing the clocks between the bank controller Bc and the first path unit P1 is not needed separately, and thus, a delay of data transmission may not occur. Accordingly, faster and more efficient data exchange can be possible.

In FIG. 14, the operating clock frequency of the first path unit P1 may be 1.5 GHZ, as an example. This may be twice the frequency of 750 MHz of the bank controller Bc. However, the embodiment is not limited thereto, and any may be possible as long as the first path unit P1 operates at integer multiples of the clock frequency of the bank controller Bc.

The second path unit P2 may be operably coupled with the bank controller Bc. The second path unit P2 may exchange the data of the cell array Ca with the first processing unit 110 not directly but via the data bus 3000. In other words, the first processing unit 110a may exchange data with the cell array Ca via the data bus 3000 and the second path unit P2. In this case, the cell array Ca may exchange data not just with the first processing unit 110a but also with other processing units.

In other words, the second path unit P2 may be a data exchange path between the cell array Ca and all the processing units when the first memory bank 211a is implemented logically in the shared memory type. The second path unit P2 may include the global controller 220 of FIG. 13.

The second path unit P2 may form an async-path. The operating clock frequency of the second path unit P2 may be the same as the operating clock frequency of the data bus 3000. Likewise, the second path unit P2 may also operate at the same clock frequency as the operating clock frequency of the data bus 3000.

In this case, the operating clock frequency of the second path unit P2 may not be synchronized with the operating clock frequency of the bank controller Bc. In this case, the clock domain crossing (CDC) operation for synchronizing the clocks between the bank controller Bc and the second path unit P2 may be required. If the operating clock frequency of the bank controller Bc and the operating clock frequency of the second path unit P2 are not synchronized with each other, the degree of freedom in the design of the clock domain may be relatively high. Therefore, the difficulty of hardware design is decreased, thereby making it possible to more easily derive the hardware operation.

The bank controller Bc may use different address systems in the case of exchanging data via the first path unit P1 and in the case of exchanging data via the second path unit P2. In other words, the bank controller Bc may use a first address system if via the first path unit P1 and a second address system if via the second path unit P2. In this case, the first address system and the second address system may be different from each other.

The bank controller Bc does not necessarily have to exist for each memory bank. In other words, the bank controller Bc is not a part for scheduling but serves to transfer signals, and thus, is not an essential part for each memory bank having two ports. Therefore, one bank controller Bc can control multiple memory banks. The multiple memory banks may operate independently even if they are controlled by the bank controller Bc. However, the embodiment is not limited thereto.

As a matter of course, the bank controller Bc may exist for each memory bank. In this case, the bank controller Bc may control each memory bank individually.

Referring to FIG. 13 and FIG. 14, if the first memory unit 210a exchanges data via the first path unit P1, the first address system may be used. If the first memory unit 210a exchanges data via the second path unit P2, the second address system may be used. Similarly, if the second memory unit 210b exchanges data via the first path unit P1, a third address system may be used. If the second memory unit 210b exchanges data via the second path unit P2, the second address system may be used. In this case, the first address system and the third address system may be the same as each other. However, the embodiment is not limited thereto.

The first address system and the third address system may each be used exclusively for the first processing unit 110a and the second processing unit 110b, respectively. The second address system may be commonly applied to the first processing unit 110a and the second processing unit 110b.

In FIG. 14, the operating clock frequency of the second path unit P2 may operate at 1 GHz, as an example. This may be a frequency that is not synchronized with the operating clock frequency of 750 MHz of the bank controller Bc. In other words, the operating clock frequency of the second path unit P2 may be freely set without being dependent on the operating clock frequency of the bank controller Bc at all.

A generic on-chip memory has used slow SRAM (e.g., 750 MHz) and a data bus faster than that (e.g., 1 GHZ), inevitably resulting in delays due to the CDC operation. On the other hand, the reconfigurable on-chip memory 200 in accordance with some embodiments of the disclosure has room to use the first path unit P1 in addition to the second path unit P2, thereby making it possible to avoid delays resulting from the CDC operation.

In addition, since the existing on-chip memory is a shared memory and a plurality of processing units use a single data bus 3000, a decrease in the overall processing speed may easily occur when the amounts of data transfer occur at the same time. On the other hand, the reconfigurable on-chip memory 200 in accordance with some embodiments of the disclosure has room to use the first path unit P1 in addition to the second path unit P2, thereby making it possible to achieve the effect of properly distributing the data throughput that could be concentrated on the global controller 220 as well.

Hereinafter, a reconfigurable on-chip memory in accordance with some embodiments of the disclosure will be described with reference to FIG. 16. The parts overlapping with the embodiments described above will be simplified or omitted.

Figure 16:
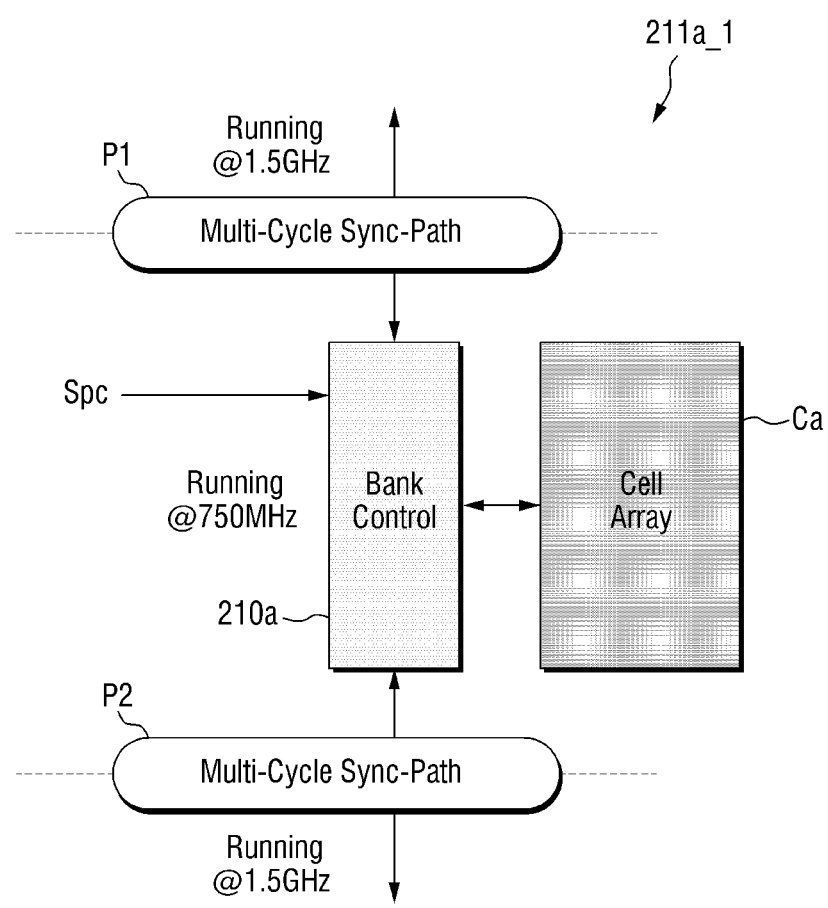
FIG. 16 is a conceptual diagram for illustrating the structure of a memory bank of a reconfigurable on-chip memory in accordance with some embodiments of the disclosure.

FIG. 16 is a conceptual diagram for illustrating the structure of a memory bank of a reconfigurable on-chip memory in accordance with some embodiments of the disclosure.

Referring to FIG. 16, a $1^{st}$ memory bank 211a_1 may operate at a clock frequency at which both the data bus 3000 and the first processing core 100 can be synced (frequencies are multiples of each other). In other words, the second path unit P2 may not need to be configured as the async-path but may be configured as the multi-cycle sync-path.

In this case, since no delay occurs due to the CDC of the second path unit P2 in addition to the first path unit P1, the calculation tasks of the reconfigurable on-chip memory 200 in accordance with some embodiments of the disclosure can be performed quickly and efficiently.

In FIG. 16, the frequency of the operating clock of the bank controller Bc may be 750 MHz that can be synced with 1.5 GHz which is the frequency of the operating clock of the first path unit P1 and the second path unit P2. Even in such a case, the effect of reconfiguration can be maintained depending on whether the first path unit P1 and the second path unit P2 are to be used as the private memory for the first processing unit 110a or as the common memory for all the processing units, and even when used as the common memory, the delay due to the CDC can be further prevented, enabling faster processing of calculation tasks.

Alternatively, when the operating clock frequency of the bank controller Bc is 1.5 GHz, which is the same as that of the first path unit P1 and the second path unit P2, the multi-cycle sync-path may not be needed either. In other words, when the reconfigurable on-chip memory 200 operates at high speed, there is neither delay due to the CDC nor the design of the multi-cycle sync-path, and thus, the difficulty level of design can be reduced.

Hereinafter, a reconfigurable on-chip memory in accordance with some embodiments of the disclosure will be described with reference to FIG. 17. The parts overlapping with the embodiments described above will be simplified or omitted.

Figure 17:
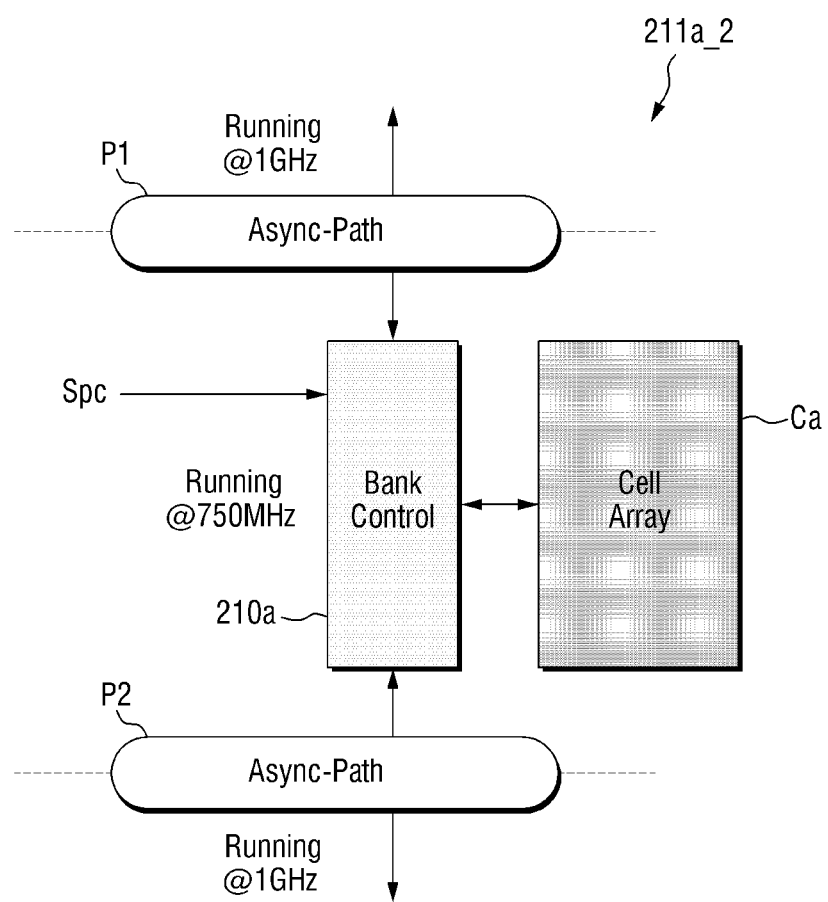
FIG. 17 is a conceptual diagram for illustrating the structure of a memory bank of a reconfigurable on-chip memory in accordance with some embodiments of the disclosure.

FIG. 17 is a conceptual diagram for illustrating the structure of a memory bank of a reconfigurable on-chip memory in accordance with some embodiments of the disclosure.

Referring to FIG. 17, a $2^{nd}$ memory bank 211a_2 may operate at a clock frequency at which the data bus 3000 and the first processing core 100 do not depend on each other. That is, the first path unit P1 may also use the async-path instead of the multi-cycle sync-path.

In this case, the freedom in designing the frequencies of the operating clocks of the first processing unit 110a, the data bus 3000, and the bank controller Bc can be obtained, allowing the choice of hardware details to be broadened in the design stage. Through this, it is possible to design devices with various performances.

In FIG. 17, the frequency of the operating clock of the bank controller Bc may be 750 MHz, which is not dependent on the frequency of the operating clock of the first path unit P1 and the second path unit P2, and the first path unit P1 and the second path unit P2 may each operate at a clock frequency of 1 GHz. As a matter of course, this is merely an example, and the first path unit P1 and the second path unit P2 may operate at different clock frequencies from each other. In this case, since there is no need to carry out a task of matching each clock frequency in the chip design stage, a little more freedom in the design stage can be obtained.

Hereinafter, a method of using a reconfigurable on-chip memory in accordance with some embodiments of the disclosure will be described with reference to FIGS. 5, 14, and 18. The parts overlapping with the embodiments described above will be simplified or omitted.

Figure 18:
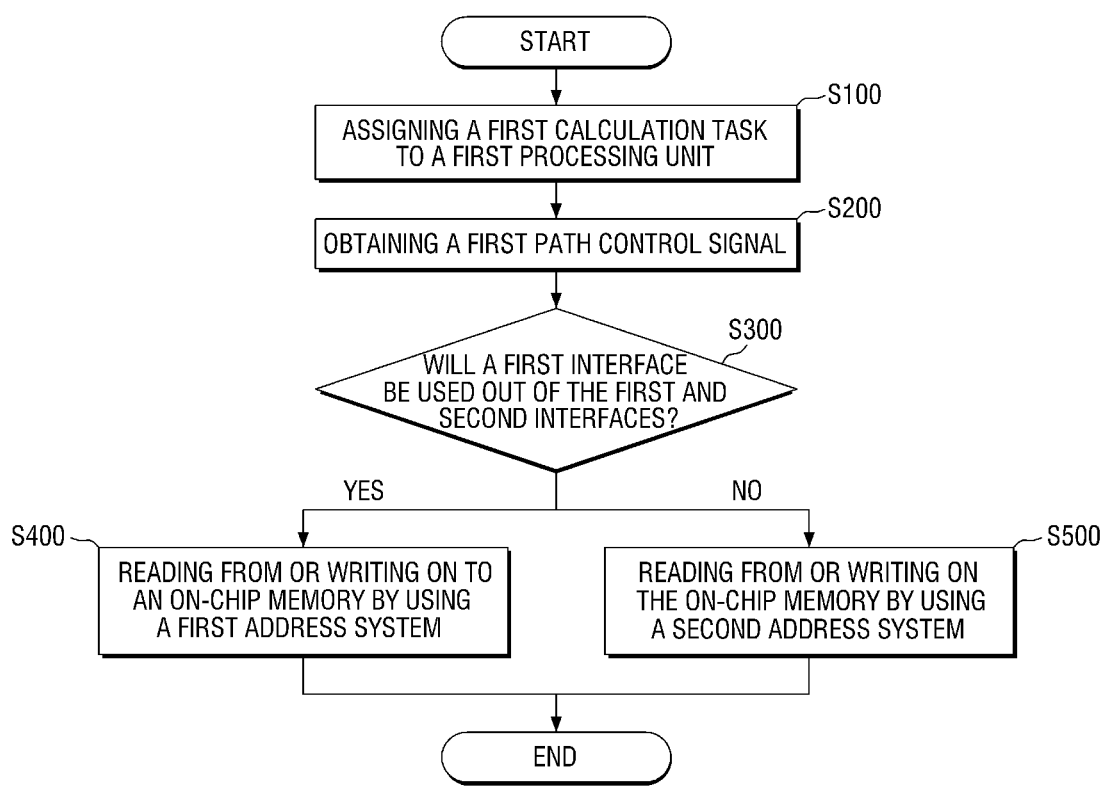
FIG. 18 is a flowchart for illustrating a method of using a reconfigurable on-chip memory in accordance with some embodiments of the disclosure.

FIG. 18 is a flowchart for illustrating a method of using a reconfigurable on-chip memory in accordance with some embodiments of the disclosure.

Referring to FIG. 18, at S100, a first calculation task is assigned to a first processing unit.

Specifically, referring to FIG. 5, a calculation task may be divided and assigned to a plurality of processing units mounted on the system-on-chip 1000. For example, the first processing unit 110*a* may be assigned with and process the first calculation task.

Again, referring to FIG. 18, at S200, a first path control signal is acquired.

Specifically, referring to FIG. 14, the bank controller Bc may determine whether to transmit or receive data in the direction of the first path unit P1, or to transmit or receive data in the direction of the second path unit P2 during the runtime. The bank controller Bc may determine a data transmission and reception direction according to a path control signal Spc.

The path control signal Spc may be generated by a pre-designed device driver or compiler. The path control signal Spc may be generated according to the characteristics of the calculation tasks. Alternatively, the path control signal Spc may be generated based on an input received from a user. In other words, the user may directly apply an input to the path control signal Spc in order to select the most optimal memory composition ratio.

Again, referring to FIG. 18, at S300, it is determined which one of first and second interfaces is to be selected.

Specifically, referring to FIG. 14, the exchange interface of data may be changed as the bank controller Bc determines the path along which the data are transmitted or received. In addition, address systems in which data are stored may vary as well.

Again, referring to FIG. 18, at S400, when the first interface is used, a read or write is performed onto the on-chip memory by using the first address system. At S500, when the second interface is used, the read or write is performed onto the on-chip memory by using the second address system (S500).

The method of using a reconfigurable on-chip memory in accordance with some embodiments of the disclosure can optimize the composition ratio of the scratch pad and the shared memory by using the on-chip memory consisting of one piece of hardware as different interfaces.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the embodiments be considered in all respects as illustrative and not restrictive, reference being made to the appended claims rather than the foregoing description to indicate the scope of the disclosure.

What is claimed is:

1. A reconfigurable on-chip memory bank comprising:
   a cell array in which a plurality of cells are arranged and data are stored;
   a first path unit configured to move data in the cell array using a first interface;
   a second path unit configured to move data in the cell array using a second interface; and
   a bank controller operably coupled with the first and second path units, and configured to:
      determine, according to a path control signal during runtime, an interface to be used to transmit or receive data for a calculation task,
      use a first address system to read or write data for the calculation task from or onto the cell array when the path control signal indicates using the first interface, and
      use a second address system different from the first address system to read or write data for the calculation task from or onto the cell array when the path control signal indicates using the second interface.

2. The reconfigurable on-chip memory bank of claim 1, wherein the first interface of the first path unit and the second interface of the second path unit are different.

3. The reconfigurable on-chip memory bank of claim 2, wherein a clock frequency of the first path unit is a multiple of a clock frequency of the bank controller.

4. The reconfigurable on-chip memory bank of claim 3, wherein a clock frequency of the second path unit is not a multiple of the clock frequency of the bank controller.

5. The reconfigurable on-chip memory bank of claim 2, wherein a first clock frequency of the first path unit is different from a first clock frequency of the second path unit.

6. The reconfigurable on-chip memory bank of claim 1, wherein the first interface of the first path unit is the same as the second interface of the second path unit.

7. The reconfigurable on-chip memory bank of claim 6, wherein a clock frequency of the first path unit is a multiple of a clock frequency of the bank controller and a clock frequency of the second path unit is a multiple of the clock frequency of the bank controller.

8. The reconfigurable on-chip memory bank of claim 6, wherein a clock frequency of the first path unit is not a multiple of a clock frequency of the bank controller and a clock frequency of the second path unit is not a multiple of the clock frequency of the bank controller.

9. The reconfigurable on-chip memory bank of claim 1, wherein the cell array comprises static random-access memory (SRAM) cells.

10. The reconfigurable on-chip memory bank of claim 1, wherein the first path unit directly transmits or receives the data to or from a first scratch pad used exclusively for a first processing unit.

11. The reconfigurable on-chip memory bank of claim 10, wherein clock frequencies of the first path unit, the first processing unit, and the first scratch pad are all the same.

12. The reconfigurable on-chip memory bank of claim 10, wherein the second path unit transmits or receives the data to or from an off-chip memory via a data bus.

13. The reconfigurable on-chip memory bank of claim 12, wherein the data bus is operably coupled with the first scratch pad and a second scratch pad, and the second scratch pad is used exclusively for a second processing unit different from the first processing unit.

14. The reconfigurable on-chip memory bank of claim 13, wherein clock frequencies of the second path unit and the data bus are the same.

15. The reconfigurable on-chip memory bank of claim 1, wherein the path control signal is generated by a pre-designed device driver or compiler.

16. The reconfigurable on-chip memory bank of claim 1, wherein the path control signal is generated based on an input received from a user.

17. A reconfigurable on-chip memory comprising:
   a plurality of scratch pads, each of the plurality of scratch pads configured to buffer data of a respective one of a plurality of processing units;
   a plurality of memory units, each of the plurality of memory units associated with a respective one of the plurality of scratch pads;
   a plurality of scratch pad controllers, each of the plurality of scratch pad controllers configured to control an associated memory unit and an associated scratch pad;
   a global controller configured to control data exchange between a respective one of the plurality of memory units and a data bus; and wherein at least one of the plurality of memory units comprises a memory cell array and a bank controller, the bank controller being configured to:
assign a calculation task to a processing unit;
obtain a path control signal according to the calculation task, wherein the path control signal indicates an interface to be used to transmit or receive data for the calculation task;
read or write the data for the calculation task from or onto the memory cell array by using a first address system when the path control signal indicates using a first interface; and
read or write the data for the calculation task from or onto the memory cell array by using a second address system different from the first address system when the path control signal indicates using a second interface.

18. The reconfigurable on-chip memory of claim 17, wherein at least one of the plurality of memory units includes at least one memory bank.

19. The reconfigurable on-chip memory of claim 17, wherein a first memory unit of the plurality of memory units operates so as to comprise a first area operating in the same manner as a first scratch pad associated with the first memory unit and a second area operating in a different manner from the first scratch pad.

20. The reconfigurable on-chip memory of claim 19, wherein a clock frequency of the first area is the same as a clock frequency of the first scratch pad.

21. The reconfigurable on-chip memory of claim 20, wherein a second memory unit of the plurality of memory units operates so as to comprise a third area operating in the same manner as a second scratch pad associated with the second memory unit and a fourth area operating in a different manner from the second scratch pad.

22. The reconfigurable on-chip memory of claim 21, wherein a first ratio of the first area to the second area is different from a second ratio of the third area to the fourth area.

23. The reconfigurable on-chip memory of claim 21, wherein the second area and the fourth area are shared by at least one of the plurality of the processing units, and the plurality of the scratch pads.

24. A system-on-chip having a reconfigurable on-chip memory mounted thereon, comprising:
a plurality of processing units; and
an on-chip memory comprising a plurality of dedicated areas and a common area for the plurality of processing units, each of the plurality of dedicated areas associated with a respective one of the plurality of processing units,
wherein the on-chip memory comprises a memory bank comprising a memory cell array and a bank controller, the bank controller being configured to:
assign a calculation task to a processing unit;
obtain a path control signal according to the calculation task, wherein the path control signal indicates an interface to be used to transmit or receive data for the calculation task;
read or write the data for the calculation task from or onto the on-chip memory by using a first address system when the path control signal indicates using a first interface; and
read or write the data for the calculation task from or onto the on-chip memory by using a second address system different from the first address system when the path control signal indicates using a second interface;
wherein the size of at least one of the plurality of dedicated areas and the size of the common area change during runtime.

25. The system-on-chip having a reconfigurable on-chip memory mounted thereon of claim 24, wherein the on-chip memory comprises:
a plurality of scratch pads configured to exclusively buffer data of a respective one of the plurality of processing units; and
a reconfigurable on-chip memory comprising a plurality of memory areas operating in the same manner as a respective one of the plurality of scratch pads, or a memory area operating in a different manner from the plurality of scratch pads,
wherein a respective one dedicated area of the plurality of dedicated areas comprises a scratch pad associated with the respective one dedicated area and a memory area operating in the same manner as the scratch pad associated with the respective one dedicated area, and
the common area comprises the memory area operating in the different manner.

26. The system-on-chip having a reconfigurable on-chip memory mounted thereon of claim 24,
wherein at least one of the processing units performs at least one of deep-learning training or deep-learning inference tasks.

27. A method of using a reconfigurable on-chip memory, comprising:
assigning a first calculation task to a first processing unit;
obtaining a first path control signal according to the first calculation task, wherein the first path control signal indicates an interface to be used to transmit or receive first data for the first calculation task;
reading or writing the first data from or onto an on-chip memory by using a first address system when the first path control signal indicates using a first interface; and
reading or writing the first data from or onto the on-chip memory by using a second address system different from the first address system when the first path control signal indicates using a second interface.

28. The method of using a reconfigurable on-chip memory of claim 27, further comprising:
receiving tasks;
classifying the tasks into the first calculation task and a second calculation task; and
assigning the second calculation task to a second processing unit different from the first processing unit.

29. The method of using a reconfigurable on-chip memory of claim 28, further comprising:
obtaining a second path control signal according to the second calculation task, wherein the second path control signal indicates an interface to be used to transmit or receive second data for the second calculation task;
reading or writing the second data from or onto the on-chip memory by using a third address system when the second path control signal indicates using a first interface; and
reading or writing the second data from or onto the on-chip memory by using the second address system when the second path control signal indicates using a second interface.

30. The method of using a reconfigurable on-chip memory of claim 29, wherein the first address system is used exclusively for the first processing unit, and
the third address system is used exclusively for the second processing unit.

31. The method of using a reconfigurable on-chip memory of claim 29, wherein the second address system is commonly applied to the first and second processing units.

\* \* \* \* \*